(12) United States Patent
Masuyama et al.

(10) Patent No.: US 8,149,308 B2
(45) Date of Patent: Apr. 3, 2012

(54) SOLID-STATE IMAGE PICKUP DEVICE

(75) Inventors: Masayuki Masuyama, Kyoto (JP); Yoshiyuki Matsunaga, Kanagawa (JP)

(73) Assignee: Panasonic Corporation, Osaka (JP)

( * ) Notice: Subject to any disclaimer, the term of this patent is extended or adjusted under 35 U.S.C. 154(b) by 1307 days.

(21) Appl. No.: 11/721,241

(22) PCT Filed: Dec. 21, 2005

(86) PCT No.: PCT/JP2005/023459
§ 371 (c)(1),
(2), (4) Date: Jun. 8, 2007

(87) PCT Pub. No.: WO2006/073057
PCT Pub. Date: Jul. 13, 2006

(65) Prior Publication Data
US 2009/0237538 A1 Sep. 24, 2009

(30) Foreign Application Priority Data
Jan. 6, 2005 (JP) .................................. 2005-001877

(51) Int. Cl.
*H04N 5/335* (2011.01)
(52) U.S. Cl. .......................... 348/300; 348/302; 348/308
(58) Field of Classification Search ........................ None
See application file for complete search history.

(56) References Cited

U.S. PATENT DOCUMENTS

| | | | |
|---|---|---|---|
| 5,274,459 A * | 12/1993 | Hamasaki ..................... 348/249 |
| 6,115,065 A * | 9/2000 | Yadid-Pecht et al. ......... 348/308 |
| 6,392,258 B1 | 5/2002 | Hirata et al. | |
| 6,528,378 B2 | 3/2003 | Hirata et al. | |
| 6,836,291 B1 | 12/2004 | Nakamura et al. | |
| 6,930,722 B1 * | 8/2005 | Nakamura et al. ............ 348/362 |
| 7,379,109 B2 | 5/2008 | Masuyama et al. | |
| 2004/0183930 A1 * | 9/2004 | Masuyama et al. ........... 348/294 |
| 2005/0052554 A1 * | 3/2005 | Sakurai et al. ................ 348/301 |
| 2007/0165117 A1 | 7/2007 | Toya et al. | |

FOREIGN PATENT DOCUMENTS

CN 1532939 9/2004
(Continued)

OTHER PUBLICATIONS

English language Abstract of CN 1532939, Sep. 29, 2004.
(Continued)

*Primary Examiner* — Luong T Nguyen
(74) *Attorney, Agent, or Firm* — Greenblum & Bernstein, P.L.C.

(57) ABSTRACT

A high dynamic range solid-state image pickup device is provided with a plurality of unit cells, which convert light into signal charges and accumulate the signal charges. The unit cells are arranged by rows and columns for outputting a signal voltage corresponding to the signal charges. A selector and a read transistor set an accumulation time period for accumulating the signal charges in the unit cells to a first period and a second period different from each other. The row selector and a vertical selection transistor select a row. Sampling capacitors (210a, 210b) are connected to the unit cell of each column. A pulse generator and sampling transistors select an arbitrary sampling capacitor from the sampling capacitors. The pulse generator and the sampling transistors perform selection so as to accumulate the signal voltage corresponding to the signal charges accumulated during the first period and the second period in the sampling capacitors, respectively.

12 Claims, 20 Drawing Sheets

FOREIGN PATENT DOCUMENTS

| | | |
|---|---|---|
| JP | 5-145859 | 6/1993 |
| JP | 9-55888 | 2/1997 |
| JP | 9-055888 | 2/1997 |
| JP | 2988557 | 10/1999 |
| JP | 11-313257 | 11/1999 |
| JP | 2000-260783 | 9/2000 |
| JP | 2001-245213 | 9/2001 |

OTHER PUBLICATIONS

English language Abstract of JP 9-55888, Feb. 25, 1997.
English language translation of paragraphs [0018]-[0022]and [0028]-[0029] of JP 9-55888, Feb. 25, 1997.
English language translation of paragraphs [0014] of JP 5-145859, Jun. 11, 1993.
English language Abstract of JP 9-055888, Feb. 25, 1997.
English language Abstract of JP 5-145859, Jun. 11, 1993.
English language Abstract of JP 2000-26078, Sep. 22, 2000.
English language Abstract of JP 11-313257, Nov. 9, 1999.
English language Abstract of JP 6-113207, Apr. 22, 1994.
U.S. Appl. No. 11/721,621 to Masuyama et al., which was filed Jun. 13, 2007.
English language translation of Fig. 10 of JP 5-145859, Jun. 11, 1993.
English language translation of paragraphs [0094]-[0100] of JP 2001-245213, Sep. 7, 2001.

* cited by examiner

SOLID-STATE IMAGE PICKUP DEVICE

TECHNICAL FIELD

The present invention relates to solid-state image pickup devices and, more particularly to a solid-state image pickup device capable of obtaining a video signal with a wide dynamic range.

BACKGROUND ART

In recent years, mobile terminals with a built-in camera, such as a camera-equipped mobile phone, have become widely available. With increasing demands for a camera built into a mobile terminal to obtain a higher-quality still image by increasing the number of pixels (mega pixels), the mobile terminal camera is expected as an alternative digital still camera (DSC). At the same time, the mobile terminal camera has to support an image with QVGA resolution or lower (approximately 80,000 pixels), considering animations and communication.

In order to meet these requirements, for example, in a CCD solid-state image pickup device with high pixel density, so-called mega pixels, data of some pixels in an image are selected to be read out, in other words, pixel thinning is performed, in order to discard data of the other pixels. In an amplification-type solid-state image pickup device, pixel signals are added together in a vertical direction within the image pickup device.

FIG. 1 shows a configuration of a solid-state image pickup device (see Patent Document 1) to exemplify a solid-state image pickup device which adds pixel signals together in a vertical direction within the image pickup device.

This conventional solid-state image pickup device includes unit cells 500; an image area 510 in which n×m unit cells 500 arranged by rows and columns; a first vertical signal line 520 which transmits signal voltage of the unit cells 500 to a signal processing unit 550 per column; a row selecting circuit 530 which selects the unit cells 500 per row; a load transistor group 540; a signal processing unit 550 which holds the signal voltage transmitted through the first vertical signal line 520 and reduces noise; a column selecting circuit 560 which selects the unit cells 500 per column; a horizontal signal line 570 which transmits the signal voltage output from the signal processing unit 550 to an output amplifier 580; and the output amplifier 580. In order to give a simple description, the unit cell 500 in the n-th row and the m-th column is shown in FIG. 1.

The unit cell 500 includes a photodiode 501 which converts light into signal charges and accumulates the signal charges; a read transistor 502 which reads the signal of the photodiode 501; an amplification transistor 503 which amplifies the signal voltage of the photodiode 501; a reset transistor 504 which resets the signal voltage of the photodiode 501; a vertical selection transistor 505 which selects a row from which the amplified signal voltage is to be read; and a floating diffusion (FD) unit 506 which detects the signal voltage of the photodiode 501.

FIG. 2 shows a circuit structure of the signal processing unit 550.

The signal processing unit 550 includes a sample/hold transistor 600 connected to the first vertical signal line 520; a clamping capacitor 610 connected to the first vertical signal line 520 through the sample/hold transistor 600; a second vertical signal line 620 connected to the first vertical signal line 520 through the clamping capacitor 610; sampling transistors 630a, 630b, and 630c connected to the second vertical signal line 620; a clamping transistor 640; a column selecting transistor 650 connected to the second vertical signal line 620; a sampling capacitor 660a connected to the second vertical signal line 620 through the sampling transistor 630a; a sampling capacitor 660b connected to the second vertical signal line 620 through the sampling transistor 630b; and a sampling capacitor 660c connected to the second vertical signal line 620 through the sampling transistor 630c.

When a sampling pulse is applied to set a SP line to a high level (Height), the sample/hold transistor 600 is turned ON thereby transmitting the signal voltage, which is transmitted through the first vertical signal line 520, to the clamping capacitor 610. When a clamp pulse is applied to set a CP line High, the clamping transistor 640 is turned ON, and a terminal B of the clamping capacitor 610 is provided with a CPDC voltage. The clamping capacitor 610 holds the voltage between the A and B terminals at the time of a reset so as to remove fixed pattern noises varying depending on the unit cells 500.

The second vertical signal line 620 transmits the signal voltage transmitted from the first vertical signal line 520 through the clamping capacitor 610.

When a capacitor selection pulse A is applied to set a SWA line High, the sampling transistor 630a is turned ON. Thereby, the sampling transistor 630a transfers the signal voltage transmitted through second vertical signal line 620 to the sampling capacitor 660a, or transfers the signal voltage of the sampling capacitor 660a to the second vertical signal line 620. When a capacitor selection pulse B is applied to set a SWB line High, the sampling transistor 630b is turned ON. Thereby, the sampling transistor 630b transfers the signal voltage transmitted through the second vertical signal line 620 to the sampling capacitor 660b, or transfers the signal voltage of the sampling capacitor 660b to the second vertical signal line 620. When a capacitor selection pulse C is applied to set a SWC line High, the sampling transistor 630c is turned ON. Thereby the sampling transistor 630c transfers the signal voltage transmitted by the second vertical signal line 620 to the sampling capacitor 660c or the signal voltage of the sampling capacitor 660c to the second vertical signal line 620.

When a clamp pulse is applied to set the CP line High, the clamping transistor 640 is turned ON, thereby resetting the second vertical signal line 620, the clamping capacitor 610, and the sampling capacitors 660a, 660b, 660c, to the potential of the CPDC line.

When a column selection pulse is applied to set a CSEL line High, the column selecting transistors 650 are turned ON one by one thereby transferring the electric charges accumulated in the sampling capacitors 660a, 660b, and 660c to the horizontal signal line 570.

The sampling capacitors 660a, 660b, and 660c accumulate the signal voltages which have been read out for each row. For example, the sampling capacitor 660a accumulates the signal voltage read from the unit cells 500 in the n-th row. The sampling capacitor 660b accumulates the signal voltage read from the unit cells 500 in the (n-1)th row. The sampling capacitor 660c accumulates the signal voltage read from the unit cells 500 in the (n-2)th row.

A description is given for an operation of the conventional solid-state image pickup device thus configured with reference to the driving timing chart shown in FIG. 3.

As the unit cells 500 in the n-th row are selected, a row selection pulse (n) for setting a LSET(n) line to High level is applied to the vertical selection transistors 505 of unit cells 500 in the n-th row. Thereby, each of the vertical selection transistors 505 is turned ON. A source follower circuit is formed by the amplification transistor 503 and the load transistor group 540. The voltage of each unit cell 500 depending on the supply voltage is output from the source follower circuit to the first vertical signal line 520.

Next, sampling pulses for setting the SP line High are applied to the sample/hold transistor 600. Each of the sample/hold transistors 600 is turned ON, so that the clamping capacitor 610 can hold the voltage outputted from the source follower circuit to the first vertical signal line 520. Here, a clamp pulse for setting the CP line High is applied to the clamping transistors 640. Each of the clamping transistors 640 is turned ON so as to reset at the side of the clamping capacitor 610 which is connected to the second vertical signal line 620 to the potential of CPDC line. Furthermore, since the capacitor selection pulse is applied to set the SWA line High at the same time, the sampling transistor 630a is turned ON so as to reset the sampling capacitor 660a to the CPDC line potential.

Next, a reset pulse (n) for setting a RESET(n) line High is applied to the reset transistors 504. Each of the reset transistors 504 is turned ON so as to reset the potential of the FD unit 506. The gate voltage of the amplification transistor 503 connected to the FD unit 506 becomes the potential of the FD unit 506. The voltage according to this voltage, specifically, a voltage obtained by (potential of FD unit−Vt)×α, is outputted to the first vertical signal line 520. In this case, the value "Vt" is the threshold voltage of the amplification transistor 503, and the value alpha is a voltage amplification factor.

Next, a clamp pulse for setting the CP line to a low level (Low) is applied to the clamping transistor 640. Thereby, the clamping transistor 640 is turned OFF, and the second vertical signal line 620 becomes a floating state.

Next, a read out pulse (n) for setting a READ(n) line High is applied to the read transistor 502. The read transistor 502 is turned ON so as to transfer the signal charges accumulated in the photodiode 501 to the FD unit 506. The gate voltage of the amplification transistor 503 connected to the FD unit 506 becomes the potential of the FD unit 506. A voltage according to this voltage, specifically, a voltage obtained by (potential of FD unit−Vt)×α, is outputted to the first vertical signal line 520. In this case, since the clamp pulse for setting the CP line Low is applied to the clamping transistor 640, the clamping transistor 640 is turned OFF. The voltage change according to the difference between the voltage output to the first vertical signal line 520 when the potential of the FD unit 506 is reset, and the voltage output to the first vertical signal line 520 when the signal charges accumulated in the photodiode 501 is transferred to the FD unit 506, is accumulated in the sampling capacitor 660a as the signal voltage of each of the unit cells 500 in the n-th row. When a capacitor selection pulse A is applied to set the SWA line Low, the sampling transistor 630a is turned OFF.

Next, the unit cells 500 in the (n−1)-th row are selected, and a capacitor selection pulse B is applied to set the SWB line High. A similar operation is performed again, so that the signal voltage of each of the unit cells 500 in the (n−1)-th row is accumulated in the sampling capacitor 660b. A capacitor selection pulse B is applied to set the SWB line Low, and thereby the sampling transistor 630b is turned OFF.

Next, the unit cells 500 in the (n−2)-th row are selected, and a capacitor selection pulse C is applied to set the SWC line High. Such an operation similar to the above is performed again, so that the signal voltage of each of the unit cells 500 in the (n−2)-th row is accumulated in the sampling capacitor 660c. A capacitor selection pulse C is applied to the SWC line Low, and thereby the sampling transistor 630c is turned OFF.

Next, capacitor selection pulses A, B, and C are applied at the same time so as to make the SWA line, the SWB line, and the SWC line High. The sampling transistors 630a, 630b, and 630c are turned ON. If no addition is performed, one of the capacitor selection pulse A, the capacitor selection pulse B, and the capacitor selection pulse C is applied so that only one of the sampling transistors 630a, 630b, and 630c is turned ON.

Next, a column selection pulse (m) for setting a CSEL(m) line High, a column selection pulse (m−1) for setting a CSEL (m−1) line High, ... are applied sequentially to the column selecting transistors 650. The column selecting transistors 650 are turned ON sequentially. The signal voltages accumulated in the sampling capacitors 660a, 660b, and, 660c are added together so as to be output to the horizontal signal line 570 sequentially.

Patent Document 1: Japanese Laid-Open Patent Application No. 2000-260783

DISCLOSURE OF INVENTION

Problems that Invention is to Solve

However, it is possible for the conventional solid-state image pickup device to detect only the light intensity within a range where the signal charges generated by the photodiode 501 do not overflow, specifically the light intensity within a range which does not exceed the saturation level of the photodiode 501. If the a quantity of light exceeds the saturation level, since signal charges of only a fixed amount is transferred to the FD unit 506, the potential of the FD unit 506 becomes constant, thereby bringing about a saturation state. Therefore, when both an extremely bright subject (in bright light) and a relatively dark subject (in low light intensity) are provided to pick up an image, for example, when a photograph is taken from the indoor side toward the outdoor, highlight details are lost in a high luminance portion, or a black blur appears in a low luminance portion. Specifically, the conventional solid-state image pickup device is disadvantageous in its narrow dynamic range.

Therefore, in order to solve the problem, Japanese Laid-Open Patent Application No. H11-313257 discloses a solid-state image pickup device which outputs a signal corresponding to the logarithm of a quantity of incoming light so as to have a wider dynamic range. However, it is difficult to miniaturize this solid-state image pickup device due to a large number of elements included in its pixel circuit.

Furthermore, Japanese Patent No. 2988557 also discloses a CCD solid-state image pickup device with a wider dynamic range. This CCD solid-state image pickup device varies the time for accumulating electric charges in a photodiode when a photograph is taken. Specifically, an image is picked up both for duration short enough so that the photodiode does not become a saturated state, and for fully long duration. The signal charges obtained for both the durations are then added together in a vertical charge-coupled device so as to achieve a wider dynamic range. However, no amplification-type solid-state image pickup device is available, which picks up an image both for short and long periods of time and then adds the obtained signal charges together to have a wider dynamic range.

Accordingly, in light of the foregoing, it is an object of the present invention to provide a solid-state image pickup device with a high dynamic range.

Means to Solve the Problems

In order to achieve the above object, an amplification-type solid-state image pickup device according to the present invention includes: a plurality of unit cells including (i) a photoelectric conversion unit operable to convert light into signal charges and to accumulate the signal charges, and (ii) a reading unit operable to read the signal charges from the photoelectric conversion unit, the unit cells being arranged by rows and columns, and each of the unit cells is operable to output amplified signals corresponding to the signal charges; and a read control unit operable to control the reading unit to read the signal charges accumulated during a first period and a second period, these periods being accumulation time periods different from each other. Further, the solid-state image pickup device may further include: a row selecting unit operable to select a row; a first capacitor element and a second capacitor element which are connected to each of the columns of the unit cells; and a capacitor selection unit operable to select one of the first capacitor element and the second capacitor element, wherein the capacitor selection unit is operable to perform the selecting, so that amplified signals corresponding to the signal charges accumulated during the first period and the second period are accumulated into the first capacitor element and the second capacitor element, respectively. Furthermore, the first and second periods may be shorter than one vertical scanning period. Still further, shorter one of the first and second periods may be shorter than one horizontal scanning period. Still further, the first capacitor element and the second capacitor element may have capacitance values different from each other.

This allows signal charges to be accumulated in the unit cells during the different accumulation time periods, and amplified signals corresponding to the signal charges to be accumulated respectively in the capacitor elements different from each other. Therefore, it becomes possible to pick up an image both for duration short enough so that the photodiode of the unit cells does not become a saturated state and for fully long duration, thereby achieving a wider dynamic range.

Still further, the solid-state image pickup device may further include a horizontal signal line which is connected to the first capacitor element and the second capacitor element, wherein the capacitor selection unit is operable to perform the selecting so that the amplified signals in the first capacitor element and the second capacitor element are read out to the horizontal signal line at the same time.

This allows amplified signals accumulated in the different capacitor elements to be added together in the horizontal signal line. Therefore, a wider dynamic range is achieved without newly providing a frame memory or the like, and without increasing the chip size.

Still further, the row selecting unit may be operable to sequentially select two rows which are separated by two or more rows apart, the read control unit may be operable to control to read the signal charges accumulated during the first period when signal charges are read from the unit cells in one of the two rows, and to control to read the signal charges accumulated during the second period when signal charges are read from the unit cells in the other row. Still further, the solid-state image pickup device may further include a horizontal signal line which is connected to the first capacitor element and the second capacitor element, wherein the capacitor selection unit is operable to perform the selecting so that the amplified signals in the first capacitor element and the second capacitor element are separately read out to the horizontal signal line. Still further, the solid-state image pickup device may further include a first horizontal signal line and a second horizontal signal line which are connected to the first capacitor element and the second capacitor element, respectively.

This sets the shorter one of the first accumulation time period and the second accumulation time period to be longer than one horizontal period. Therefore, the accumulation time periods are set with a high degree of flexibility.

Still further the row selecting unit may include a select circuit operable to control the selecting of the two rows which are separated by two or more rows apart.

This allows amplified signals in different rows to be read by the select circuit such as a logic circuit. Therefore, a shift register for generating a plurality of read out signals is no longer required, thereby achieving a wider dynamic range, without increasing the chip size.

Still further, the capacitor selection unit may be operable to perform the selecting based on a ratio between the first period and the second period. Still further, the capacitor selection unit may be operable to perform the selecting so that signal-to-noise ratios of the amplified signals accumulated in the first capacitor element and the second capacitor element become similar.

According to this configuration, the capacitance values of the capacitor elements for accumulating the amplified signals of the first accumulation time period and the second accumulation time period are optimized.

Still further, each of the first and second capacitor elements, a period setting unit, the capacitor selection unit, and the row selecting unit may be an NMOS-type transistor.

According to this configuration, since these capacitors are N-type MOS transistors, a quick response characteristic is obtained. Furthermore, it becomes possible to form the capacitor with one layered polysilicon, not with two layers made of polysilicon, thereby simplifying its manufacturing process.

Moreover, an amplification-type solid-state image pickup device according to the present invention includes: a plurality of unit cells including (i) a photoelectric conversion unit operable to convert light into signal charges and to accumulate the signal charges, and (ii) a reading unit operable to read the signal charges from the photoelectric conversion unit, the unit cells being arranged by rows and columns, and each of the unit cells is operable to output amplified signals corresponding to the signal charges; and a read control unit operable to control the reading unit to read the signal charges accumulate during a first period and during a second period, these periods are accumulation time periods different from each other, wherein the read control unit is operable to: control the reading unit to read the signal charges accumulated during the first and second periods which are different from each other when the amplified signals of the unit cells in a plurality of the rows are not added together; and control the reading unit to add together signal charges accumulated during a third accumulation time period in the different rows and to read the added signal charges when the amplified signals of the unit cells in the plurality of the rows are added together. Further, the solid-state image pickup device may further include: a row selecting unit operable to select a row; a first capacitor element and a second capacitor element which are connected to each of the columns of the unit cells; and a capacitor selection unit operable to select an arbitrary capacitor element out of the first capacitor element and the second capacitor element, wherein the capacitor selection unit is operable to: perform the selecting so that the amplified signals corresponding to the signal charges accumulated during the first period and the second period are accumulated into the first capacitor element and the second capacitor element, respectively, when the amplified signals of the unit cells in the plurality of the rows are not added together; and perform the selecting so that the amplified signals corresponding to the signal charges accumulated during the third period in the different unit cells in the plurality of the rows are accumulated into one of the first capacitor element and the second capacitor element, when the amplified signals of the unit cells in the plurality of the rows are added together.

According to this configuration, under low-light intensity condition, sensitivity is improved using the addition mode, while under high-light intensity condition, a dynamic range is increased using non-addition mode. Thereby, it is possible to realize an amplification-type solid-state image pickup device which is applicable to various imaging conditions.

Effects of the Invention

According to the present invention, there is provided a solid-state image pickup device which obtains a wider dynamic range without increasing the chip size. Furthermore, a solid-state image pickup device is achieved which can set accumulation time periods with a high degree of flexibility. Furthermore, it is possible to realize an amplification-type solid-state image pickup device which can be applied to various imaging conditions.

Therefore, the present invention provides a solid-state image pickup device with a high dynamic range, which means its practical value is extremely high.

NUMERICAL REFERENCES

Figure 1:
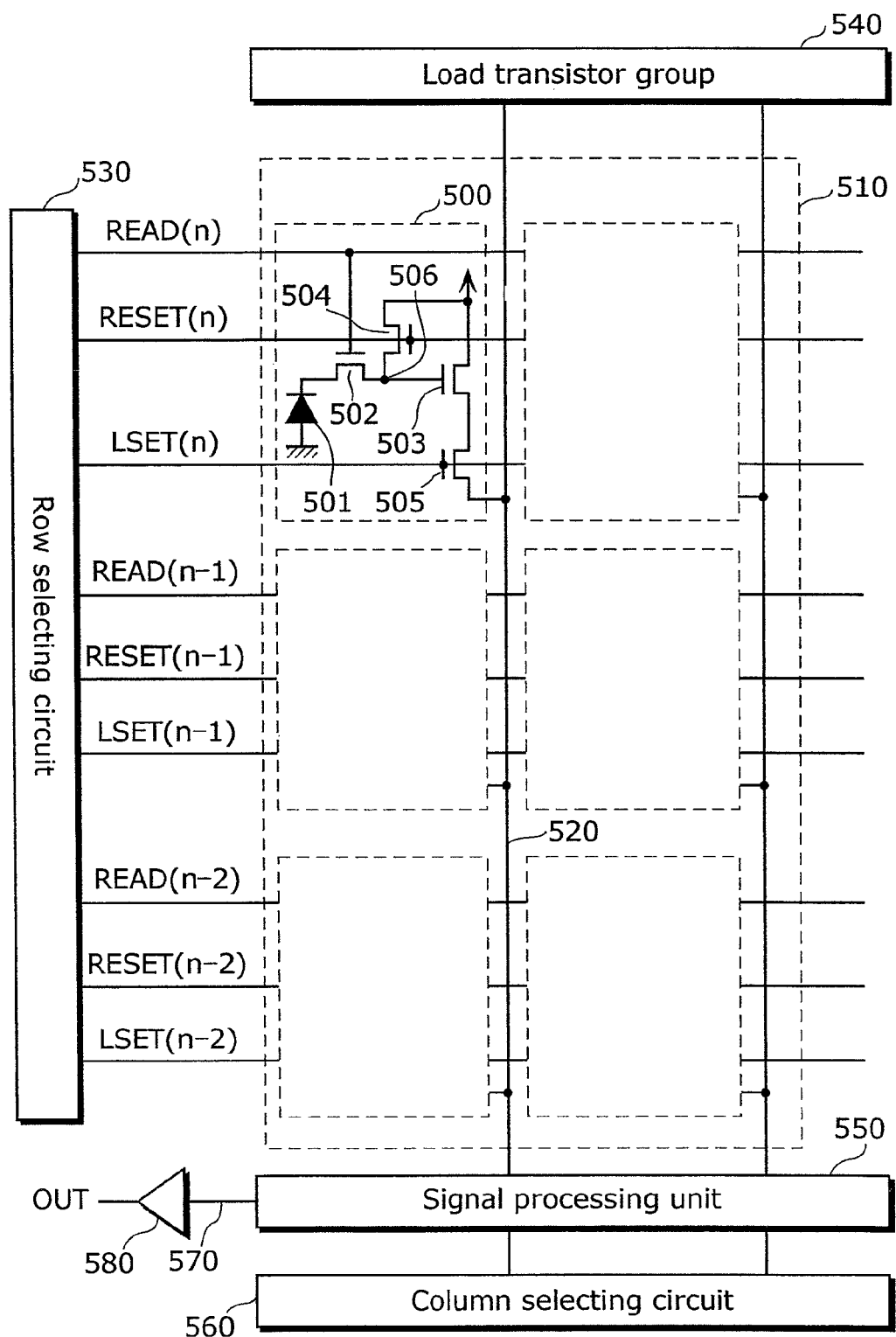
FIG. 1 shows a configuration of a conventional solid-state image pickup device.

100, 550, 700, 1500 Signal processing unit
110, 530, 710, 720, 1510 Row selecting circuit
200a, 200b, 200c, 630a, 630b, 630c, 800a, 800b, 800c Sampling transistor
210a, 210b, 210c, 660a, 660b, 660c, 810a, 810b, 810c Sampling capacitor
220, 820, 1020, 1620 Pulse generating circuit
230 Horizontal signal line capacitor
500 Unit cell
501 Photodiode
502 Read transistor
503 Amplification transistor
504 Reset transistor
505 Vertical selection transistor
506 FD unit
510 Image area
520 First vertical signal line
540 Load transistor group
560 Column selecting circuit
570 Horizontal signal line
570a First horizontal signal line
570b Second horizontal signal line
580 Output amplifier
600 Sample/hold transistor
610 Clamping capacitor
620 Second vertical signal line
640 Clamping transistor
650 Column selecting transistor
1520 Logic circuit

BEST MODE FOR CARRYING OUT THE INVENTION

Hereinafter, a description is given for an amplification-type solid-state image pickup device according to preferred embodiments of the present invention with reference to accompanying drawings.

(First Embodiment)

Figure 4:
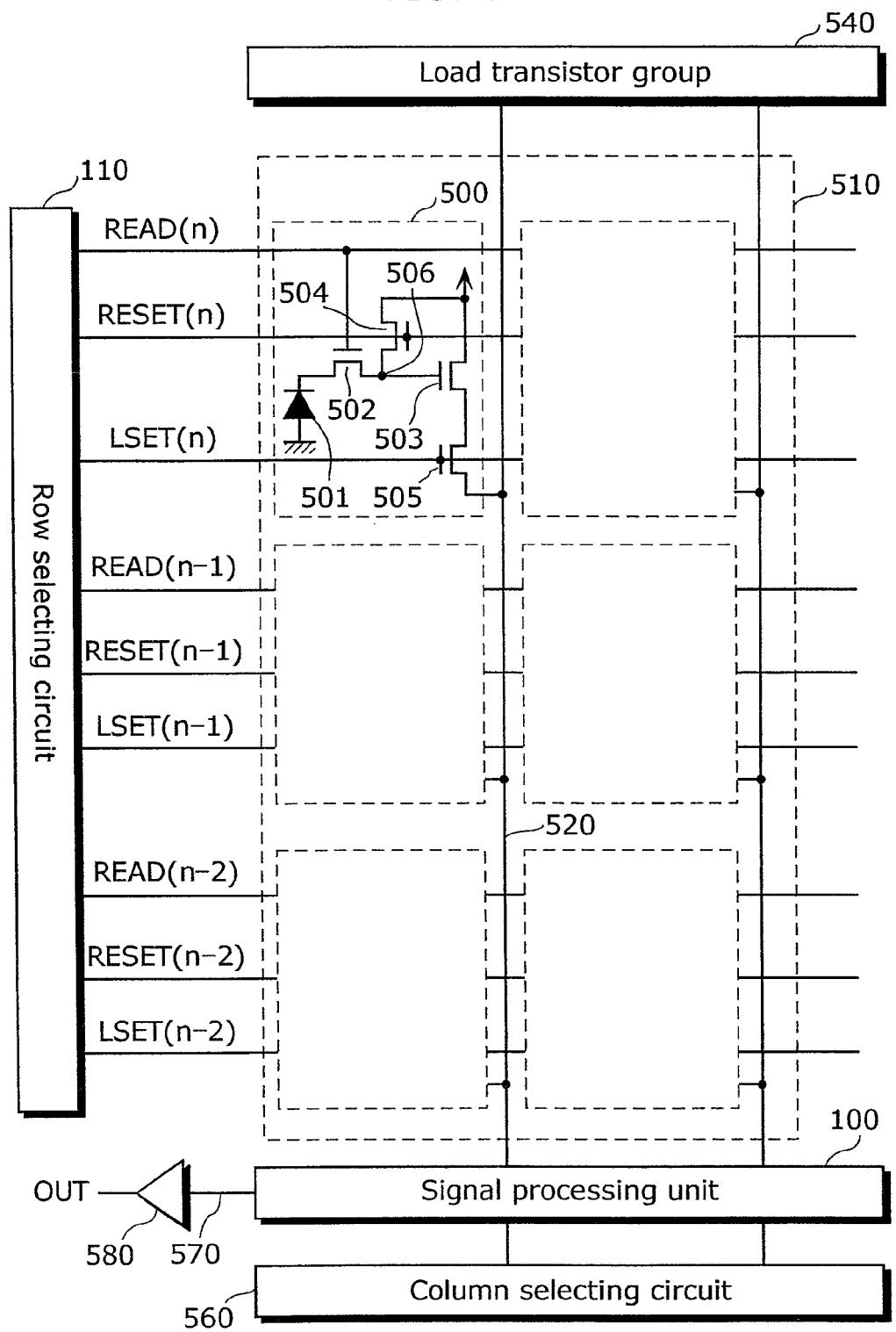
FIG. 4 shows a configuration of an amplification-type solid-state image pickup device according to a first embodiment of the present invention.

FIG. 4 shows a configuration of an amplification-type solid-state image pickup device according to the first embodiment. In FIG. 4, the elements which are the same as in FIG. 1 are assigned with the same reference numerals and their details are not explained again below.

The amplification-type solid-state image pickup device according to this embodiment includes a signal processing unit and a row selecting circuit which are different from those of the conventional solid-state image pickup device. The amplification-type solid-state image pickup device according to this embodiment has the first mode in which signal voltages of unit cells are not added with signal voltages of unit cells in a different row; and the second mode in which signal voltages are added with signal voltages of a different row. The amplification-type solid-state image pickup device includes a signal processing unit 100; a row selecting circuit 110; unit cells 500; an image area 510; a first vertical signal line 520; a load transistor group 540; a column selecting circuit 560; a horizontal signal line 570; and an output amplifier 580. In order to give a simple description, only one unit cell 500 in the n-th row and the m-th column is shown in FIG. 4.

Each of the unit cells 500 includes a photodiode 501, a read transistor 502, an amplification transistor 503, a reset transistor 504, a vertical selection transistor 505, and an FD unit 506.

The row selecting circuit 110, which serves as a row selecting unit together with the vertical selection transistor 505, selects unit cells 500 per row. Furthermore, the row selecting circuit 110, which serves also as a read control unit, controls periods of time during which signal charges are accumulated in the photodiode 501 (accumulation time period). Specifically, in the first mode, the row selecting circuit 110 sets accumulation time periods to: the first period shorter than one vertical scanning period; and the second period shorter than the first period are set as accumulation time periods. In the second mode, the row selecting circuit 110 sets an accumulation time period to the third period which is the vertical scanning period. For example, the second period is set to be shorter than one horizontal period while the first period is set to a period obtained by subtracting the second period from the vertical scanning period.

Figure 2:
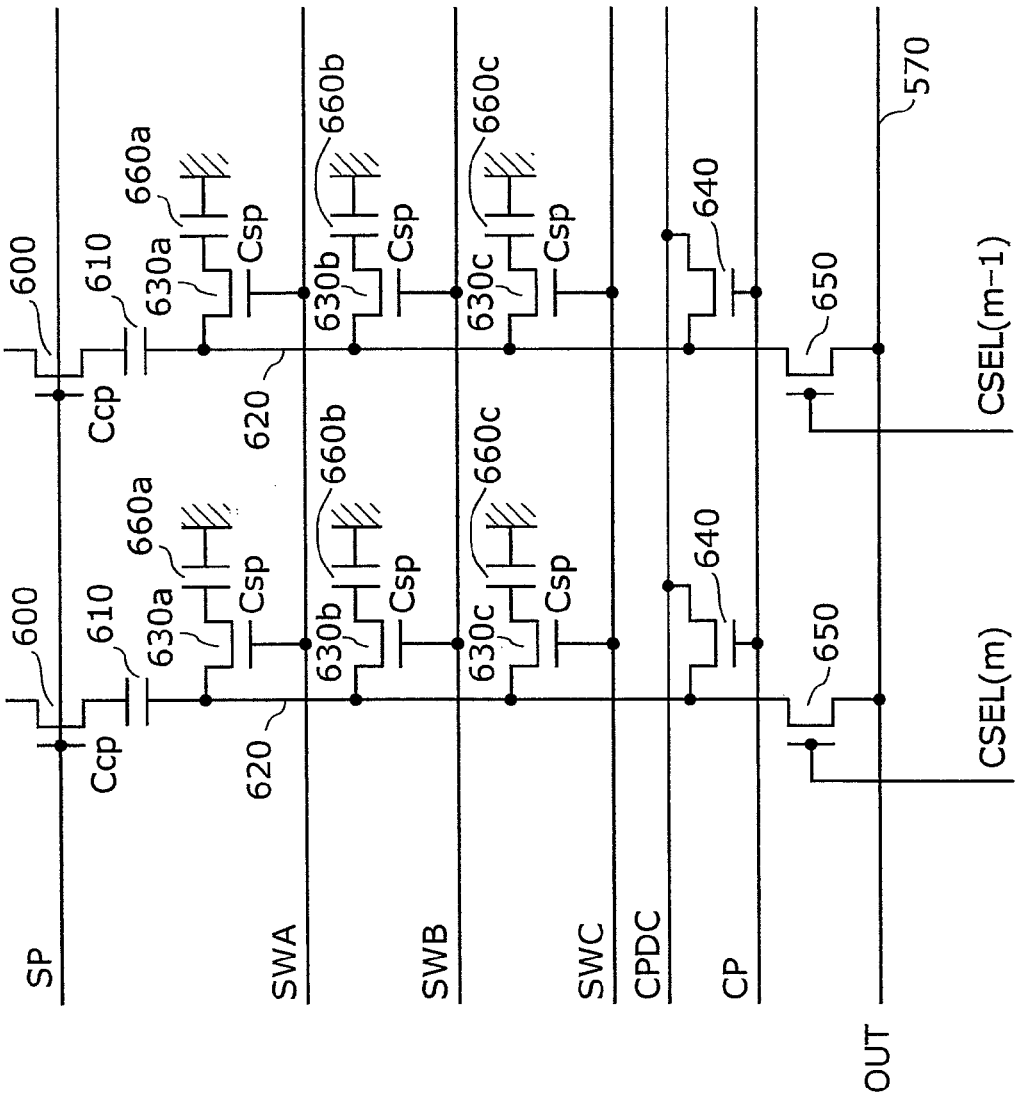
FIG. 2 is a circuit structure of a signal processing unit of the conventional solid-state image pickup device.
Figure 3:
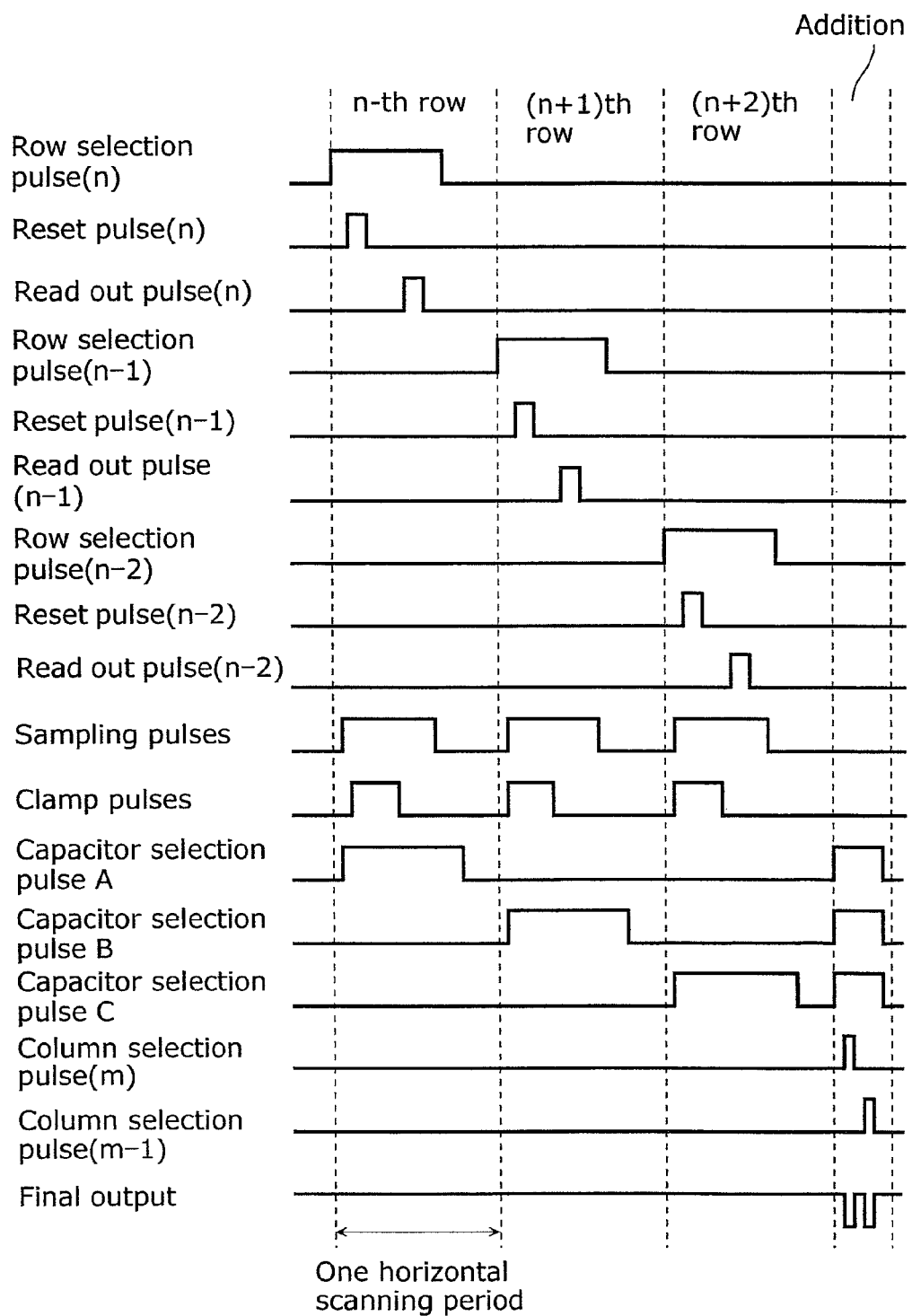
FIG. 3 is a driving timing chart showing an operation of the conventional solid-state image pickup device.
Figure 5:
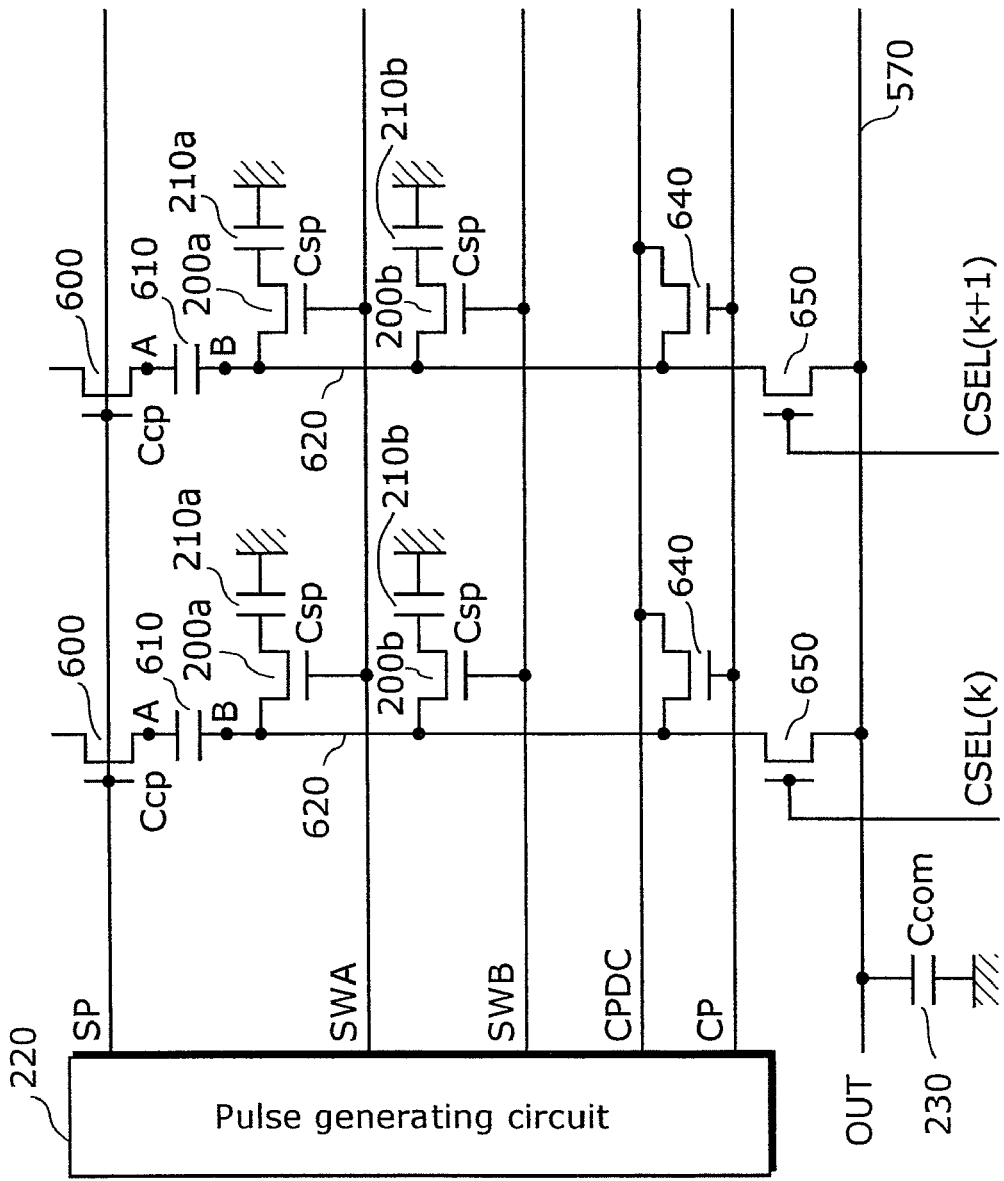
FIG. 5 is a circuit structure of a signal processing unit of the amplification-type solid-state image pickup device according to the first embodiment.

FIG. 5 shows a circuit structure of the signal processing unit 100. In FIG. 5, the elements which are the same as in FIG. 2 are assigned with the same reference numerals and their details are not explained again below.

The signal processing unit 100 includes sampling transistors 200a and 200b; a sampling capacitor 210a connected to a second vertical signal line 620 through the sampling transistor 200a; a sampling capacitor 210b connected to the second vertical signal line 620 through the sampling transistor 200b; a pulse generating circuit 220; a sample/hold transistor 600; a clamping capacitor 610; the second vertical signal line 620; a clamping transistor 640; a column selecting transistor 650; and a horizontal signal line capacitor 230 connected to the horizontal signal line 570. In this case, a capacitance value of the clamping capacitor 610 is represented as "Ccp".

When a capacitor selection pulse A is applied to set a SWA line High, the sampling transistor 200a is turned ON. Thereby, the sampling transistor 200a transfers the signal voltage transmitted through the second vertical signal line 620 to the sampling capacitor 210a, or transfers the signal voltage of the sampling capacitor 210a to the second vertical signal line 620. Furthermore, when a capacitor selection pulse B is applied to set a SWB line High, the sampling transistor 200b is turned ON. Thereby, the sampling transistor 200b transfers the signal voltage transmitted through the second vertical signal line 620 to the sampling capacitor 210b, or transfers the signal voltage of the sampling capacitor 210b to the second vertical signal line 620.

In the first mode, the sampling capacitors 210a and 210b accumulate, during the first and second periods, respectively, the signal voltages corresponding to the signal charges accumulated in an identical photodiode 501 in the same row. In the second mode, the sampling capacitors 210a and 210b accumulate, during the third period, the signal voltages corresponding to the signal charges accumulated in different photodiodes 501 in different rows, respectively. In this case, a capacitance value of the sampling capacitor 210a is represented as "Csp", and a capacitance value of the sampling capacitor 210b as "Csp".

The horizontal signal line capacitor 230 represents the floating capacitance due to the column selecting transistor 650 and the horizontal signal line 570. In this case, a capacitance value of the horizontal signal line capacitor 230 is represented as "Ccom".

The pulse generating circuit 220, which serves as a capacitor selection unit together with the sampling transistors 200a and 200b, selects, from the sampling capacitors 210a and 210b, an arbitrary sampling capacitor for accumulating a signal voltage therein. Specifically, in the first mode, the selecting is performed so that signal voltage corresponding to signal charges accumulated during the first period is accumulated into the sampling capacitor 210a, while signal voltage corresponding to signal charges accumulated during the second period is accumulated into the sampling capacitor 210b. In the second mode, the selecting is performed so that signal voltages, which correspond to respective signal charges of the different unit cells and are accumulated during the third period, are accumulated into the sampling capacitor 210a or the sampling capacitor 210b. Furthermore, the pulse generating circuit 220 selects a sampling capacitor so that the signal voltages accumulated in the sampling capacitors 210a and 210b are read out to the horizontal signal line 570 at the same time.

Figure 6:
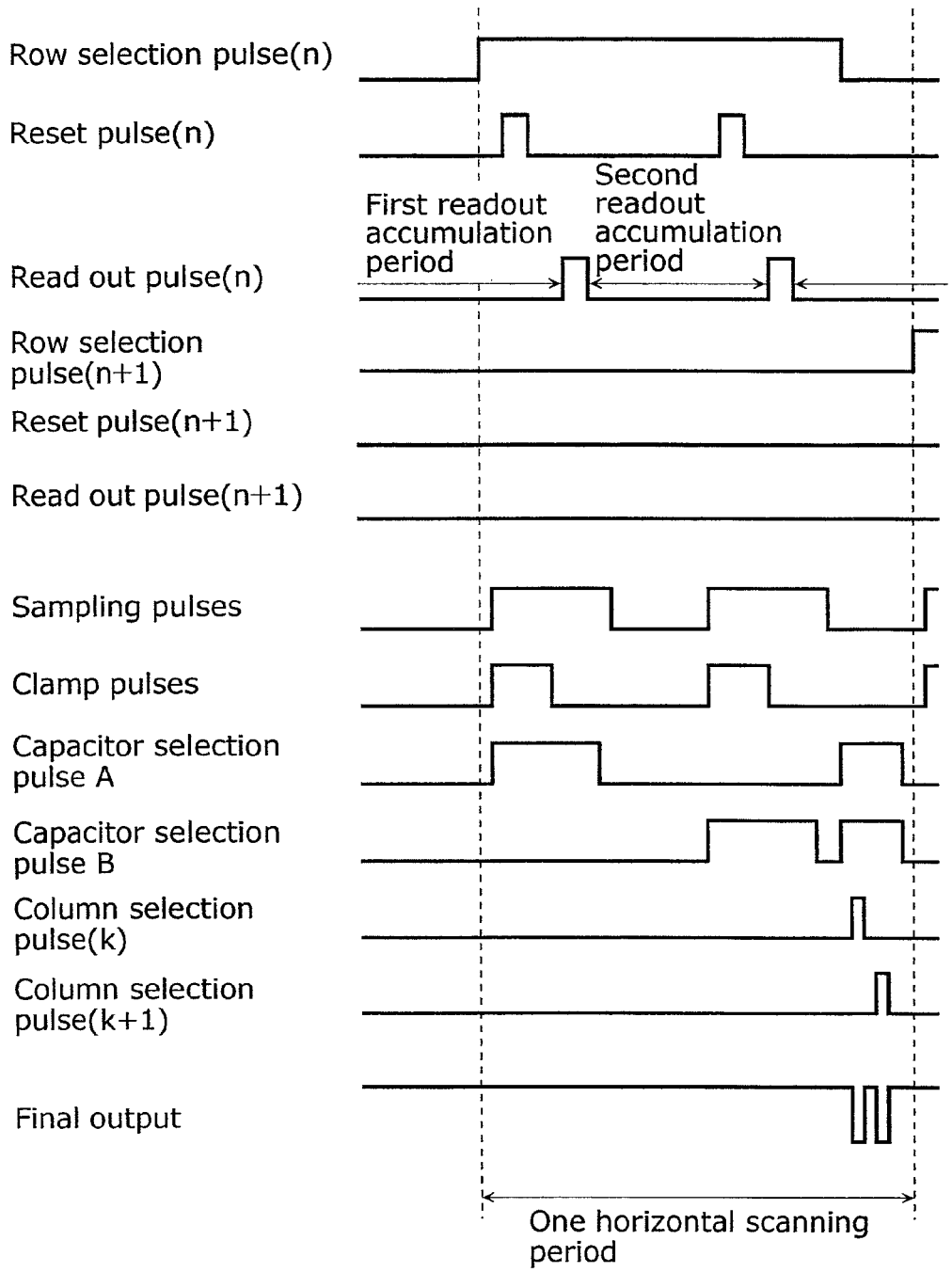
FIG. 6 is a driving timing chart showing an operation (first mode operation) of the amplification-type solid-state image pickup device according to the first embodiment.

Hereinafter, a description is given for an operation (first mode operation) of the amplification-type solid-state image pickup device thus configured with reference to the driving timing chart shown as FIG. 6.

As the unit cells 500 in the n-th row are selected, a row selection pulse (n) for setting a LSET(n) line High is applied to the vertical selection transistors 505 of unit cells 500 in the n-th row. Thereby, each of the vertical selection transistors 505 is turned ON. A source follower circuit is formed by the amplification transistor 503 and the load transistor group 540. The voltage of each unit cell 500 depending on the supply voltage is output from the source follower circuit to the first vertical signal line 520.

Next, a sampling pulse for setting a SP line High is applied to the sample/hold transistors 600. Each of the sample/hold transistors 600 is turned ON, so that the clamping capacitor 610 can hold the voltage outputted from the source follower circuit to the first vertical signal line 520. Here, a clamp pulse for setting a CP line High is applied to the clamping transistors 640. Each of the clamping transistors 640 is turned ON accordingly so as to reset at the side of the clamping capacitor 610 which is connected to the second vertical signal line 620 to the potential of a CPDC line. Furthermore, since the capacitor selection pulse A for setting the SWA line High is applied to the sampling transistors 200a at the same time, each of the sampling transistors 200a is turned ON so as to reset the sampling capacitor 210a to the CPDC line potential.

Next, a reset pulse (n) for setting a RESET(n) line High is applied to the reset transistors 504 of the unit cells 500 in the n-th row. Each of the reset transistors 504 is turned ON so as to reset the potential of the FD unit 506. The gate voltage of the amplification transistor 503 connected to the FD unit 506 becomes the potential of the FD unit 506. A voltage according to this voltage, specifically, a voltage obtained by (potential of FD unit−Vt)×α, is outputted to the first vertical signal line 520.

Next, a clamp pulse for setting the CP line Low is applied to the clamping transistors 640. Each of the clamping transistors 640 is turned OFF, and the second vertical signal line 620 becomes a floating state.

Next, a read out pulse (n) for setting a READ(n) line High is applied to the read transistor 502 of each unit cell 500 in the n-th row. The read transistor 502 is turned ON so as to transfer the signal charges accumulated in the photodiode 501 to the FD unit 506. The gate voltage of the amplification transistor 503 connected to the FD unit 506 becomes the potential of the FD unit 506. A voltage substantially equal to this voltage is output to the first vertical signal line 520. Since the clamp pulse for setting the CP line Low is applied to the clamping transistors 640 at the same time, each of the clamping transistors 640 is turned OFF. In the sampling capacitor 210a, the difference between the voltage output to the first vertical signal line 520 when the potential of the FD unit 506 is reset, and the voltage output to the first vertical signal line 520 when the signal charges accumulated in the photodiode 501 are transferred to the FD unit 506, is accumulated as the signal voltage of the first period of each unit cell 500 in the n-th row. A capacitor selection pulse A for setting the SWA line Low is then applied so that the sampling transistor 200a is turned OFF. A read out pulse (n) for setting the READ(n) line Low is also applied, and the read transistor 502 of each unit cell 500 in the n-th row is turned OFF.

In this case, the signal voltage of the first period to be accumulated in the sampling capacitor 210a corresponds to the signal charges accumulated in the photodiode 501 after the last application of the read out pulse (n) for setting the READ (n) line High so as to read the signal voltage of the second period, until another read out pulse (n) for setting the READ(n) line High is applied this time again so as to read the signal voltage of the first period.

Next, a sampling pulse for setting the SP line High, and a clamp pulse for setting the CP line High are applied. Since the capacitor selection pulse B for setting the SWB line High is applied at the same time, the sampling transistor 200b is turned ON, and the sampling capacitor 210b is reset to the potential of the CPDC line. Next, a reset pulse (n) for setting the RESET(n) line High is applied to reset the potential of the FD unit 506.

Next, a clamp pulse for setting the CP line Low is applied to the clamping transistor 640, and the second vertical signal line 620 becomes a floating state.

Next, a read out pulse (n) for setting the READ(n) line High is applied to the read transistor 502 of each unit cell 500 in the n-th row so as to transfer the signal charges accumulated in the photodiode 501 to the FD unit 506. The gate voltage of the amplification transistor 503 connected to the FD unit 506 becomes the potential of the FD unit 506. A voltage substantially equal to this voltage is output to the first vertical signal line 520. Since the clamp pulse for setting the CP line Low is applied at the same time, the signal voltage of the second period of each of the unit cells 500 in the n-th row is accumulated into the sampling capacitor 210b. A capacitor selection pulse B for setting the SWB line Low is applied, and the sampling transistor 200b is turned OFF.

In this case, the signal voltage of the second period to be accumulated in the sampling capacitor 210b corresponds to the signal charges accumulated in the photodiode 501 after the last application of the read out pulse (n) for setting the READ(n) line High so as to read the signal voltage of the first period, until a read out pulse (n) for setting the READ(n) line High is applied this time so as to read the signal voltage of the second period.

Next, a capacitor selection pulse A for setting the SWA line High and a capacitor selection pulse B for setting the SWB line High are applied at the same time.

Figure 7:
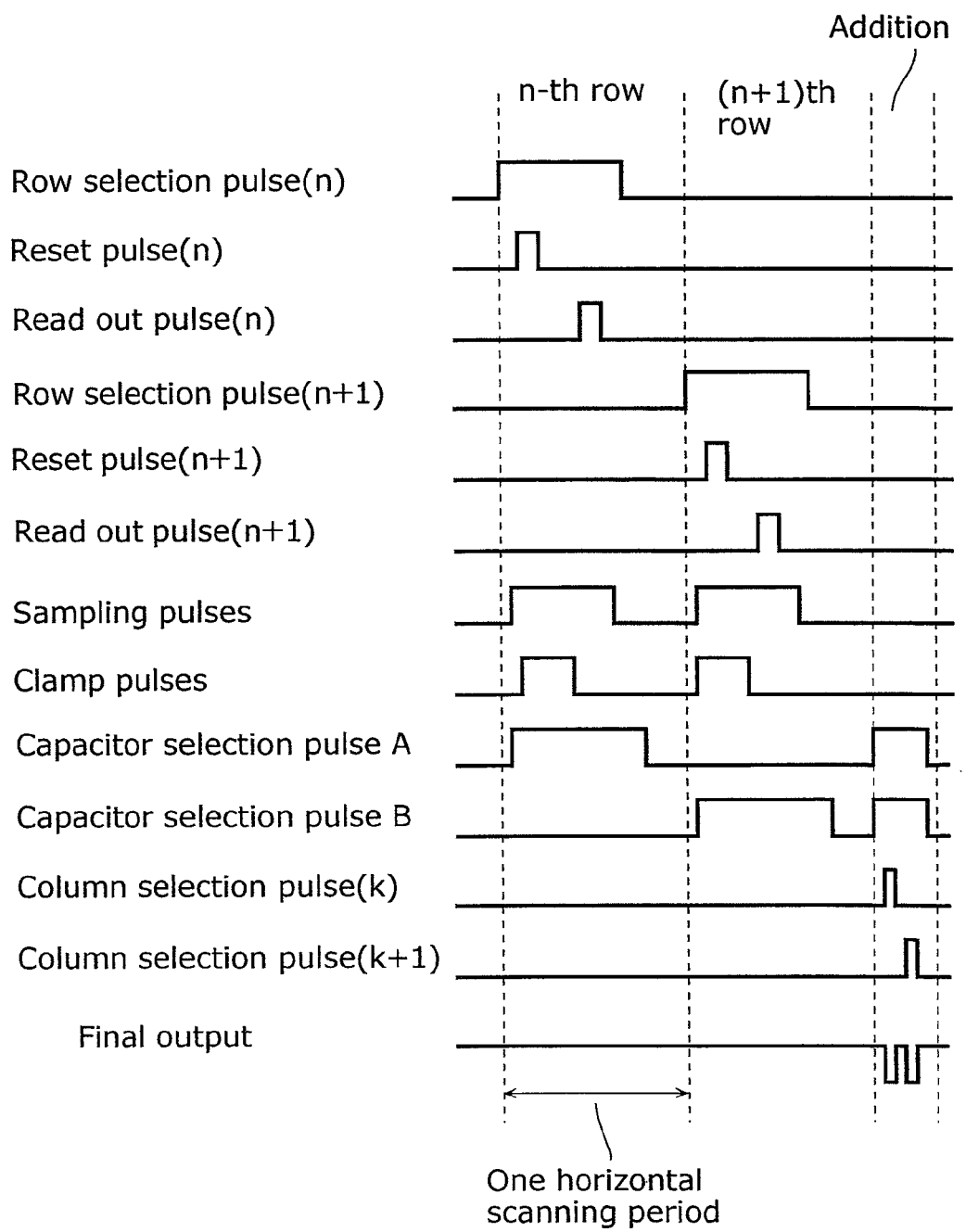
FIG. 7 is a driving timing chart showing another operation (second mode operation) of the amplification-type solid-state image pickup device according to the first embodiment.

Next, a column selection pulse (k) for setting a CSEL(k) line High, a column selection pulse (k+1) for setting a CSEL (k+1) line High, . . . are sequentially applied to the column selecting transistors 650. The column selecting transistors 650 are turned ON sequentially. The signal voltages accumulated in the sampling capacitor 210a and the sampling capacitor 210b are added together to be output to the horizontal signal line 570 sequentially. Hereinafter, a description is given for another operation (second mode operation) of the amplification-type solid-state image pickup device according to this embodiment of the present invention with reference to the driving timing chart shown as FIG. 7.

First, as the unit cells 500 in the n-th row are selected, a row selection pulse (n) for setting a LSET(n) line High is applied to the vertical selection transistors 505 of unit cells 500 in the n-th row. Thereby, each of the vertical selection transistors 505 is turned ON. A source follower circuit is formed by the amplification transistor 503 and the load transistor group 540. The voltage depending on the supply voltage of each of the unit cells 500 is output from the source follower circuit to the first vertical signal line 520.

Next, a sampling pulse for setting a SP line High is applied to each of the sample/hold transistors 600. The voltage output from the source follower circuit to the first vertical signal line 520 is held in the clamping capacitor 610. Since the clamp pulse for setting the CP line High is applied to the clamping transistor 640 at the same time, at the side of the clamping capacitor 610 which is connected to the second vertical signal line 620 is reset to the potential of the CPDC line. Furthermore, since the capacitor selection pulse A for setting the SWA line High is applied to the sampling transistor 200a at the same time, the sampling capacitor 210a is reset to the potential of the CPDC line.

Next, a reset pulse (n) for setting a RESET(n) line High is applied to the reset transistor 504 of each of the unit cells 500 in the n-th row. The reset transistor 504 is turned ON so as to reset the potential of the FD unit 506. The gate voltage of the amplification transistor 503 connected to the FD unit 506 becomes the potential of the FD unit 506. A voltage according to this voltage is output to the first vertical signal line 520.

Next, a clamp pulse for setting the CP line Low is applied. The clamping transistor 640 is turned OFF, and the second vertical signal line 620 becomes a floating state.

Next, a read out pulse (n) for setting a READ(n) line High is applied to the read transistor 502 of each of the unit cells 500 in the n-th row. The signal charges accumulated in the photodiode 501 is transferred to the FD unit 506. The gate voltage of the amplification transistor 503 connected to the FD unit 506 becomes the potential of the FD unit 506. A voltage substantially equal to this voltage is output to the first vertical signal line 520. Since the clamp pulse for setting the CP line Low is applied to the clamping transistor 640 at the same time, the signal voltage of the third period of each of the unit cells 500 in the n-th row is accumulated in the sampling capacitor 210a. A capacitor selection pulse A for setting the SWA line Low, and a read out pulse (n) for setting the READ (n) line Low are then applied.

Next, the unit cells 500 in the (n+1)th row are selected, and a capacitor selection pulse B for setting the SWB line High is applied. An operation similar to the above is performed again, so that the signal voltage of the third period of each of the unit cells 500 in the (n+1)th row is accumulated in the sampling capacitor 210b. A capacitor selection pulse B for setting the SWB line Low is then applied, and the sampling transistor 200b is turned OFF.

In this case, the signal voltage of the third period to be accumulated in the sampling capacitors 210a and 210b corresponds to the signal charges accumulated in the photodiode 501 after the last application of the read out pulse (n) for setting the READ (n) line High so as to read the signal voltage of the third period, until a read out pulse (n) for setting the READ (n) line High is applied this time so as to read the signal voltage of the third period.

Next, a capacitor selection pulse A for setting the SWA line High, and a capacitor selection pulse B for setting the SWB line High are applied at the same time.

Next, a column selection pulse (k) for setting a CSEL(k) line High, a column selection pulse (k+1) for setting a CSEL (k+1) line High, . . . are sequentially applied to the column selecting transistors 650. The column selecting transistors 650 are turned ON sequentially. The signal voltages accumulated in the sampling capacitor 210a and the sampling capacitor 210b are added together to be output to the horizontal signal line 570 sequentially.

Figure 8:
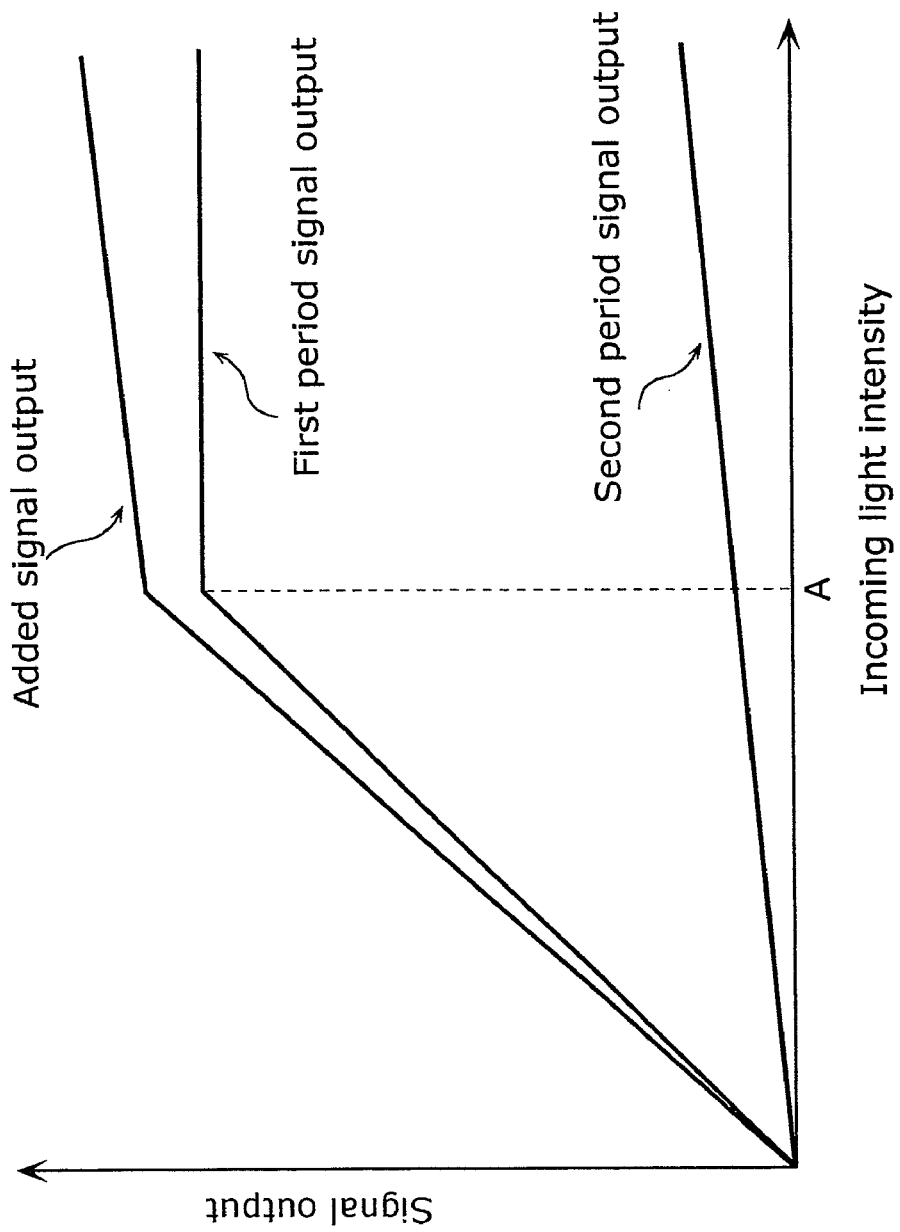
FIG. 8 shows characteristics between incoming light intensity and signal output in the amplification-type solid-state image pickup device according to the first embodiment.

FIG. 8 shows characteristics between incoming light intensity and signal output in the amplification-type solid-state image pickup device according to this embodiment.

As is clear from FIG. 8, the signal output corresponding to the signal charges accumulated during the first period becomes saturated at the incoming light intensity value 'A', and does not increase within a region having an incoming light intensity larger than an incoming light intensity value of "A". On the other hand, the signal output corresponding to the signal charges accumulated during the second period does not become saturated even at the incoming light intensity value "A", and still increases within the region having an incoming light intensity larger than the incoming light intensity "A". Therefore, the signal output corresponding to the added signal charges accumulated during the first and second periods does not become saturated even within the region having a large incoming light intensity. Specifically, the dynamic range becomes wider.

As has been described above, in the amplification-type solid-state image pickup device according to this embodiment, signal charges are accumulated in the photodiode 501 during the different accumulation time periods. The signal voltages corresponding to the signal charges are accumulated respectively in the sampling capacitors different from each other. Therefore, it is possible to pick up an image both for duration short enough so that the photodiode does not become saturated, and for fully long duration, thereby achieving a wider dynamic range.

Furthermore, in the amplification-type solid-state image pickup device according to this embodiment, the signal voltages accumulated in the sampling capacitors different from each other are read out to the horizontal signal line 570 at the same time so as to be added together. Since a wider dynamic range is achieved without newly providing a frame memory or the like, the amplification-type solid-state image pickup device according to this embodiment obtains a wider dynamic range without increasing the chip size.

Furthermore, the amplification-type solid-state image pickup device according to this embodiment achieves both of the second mode in which the signal voltages of unit cells 500 in rows different from each other are added together, and the first mode in which the signal voltages are not added together. It becomes possible to improve sensitivity in low-light intensity conditions using the second (addition) mode, or alternatively to obtain a wider dynamic range in bright-light conditions using the first (non-addition) mode. Therefore, the amplification-type solid-state image pickup device according to this embodiment can be applied to various imaging conditions.

(Second Embodiment)

Figure 9:
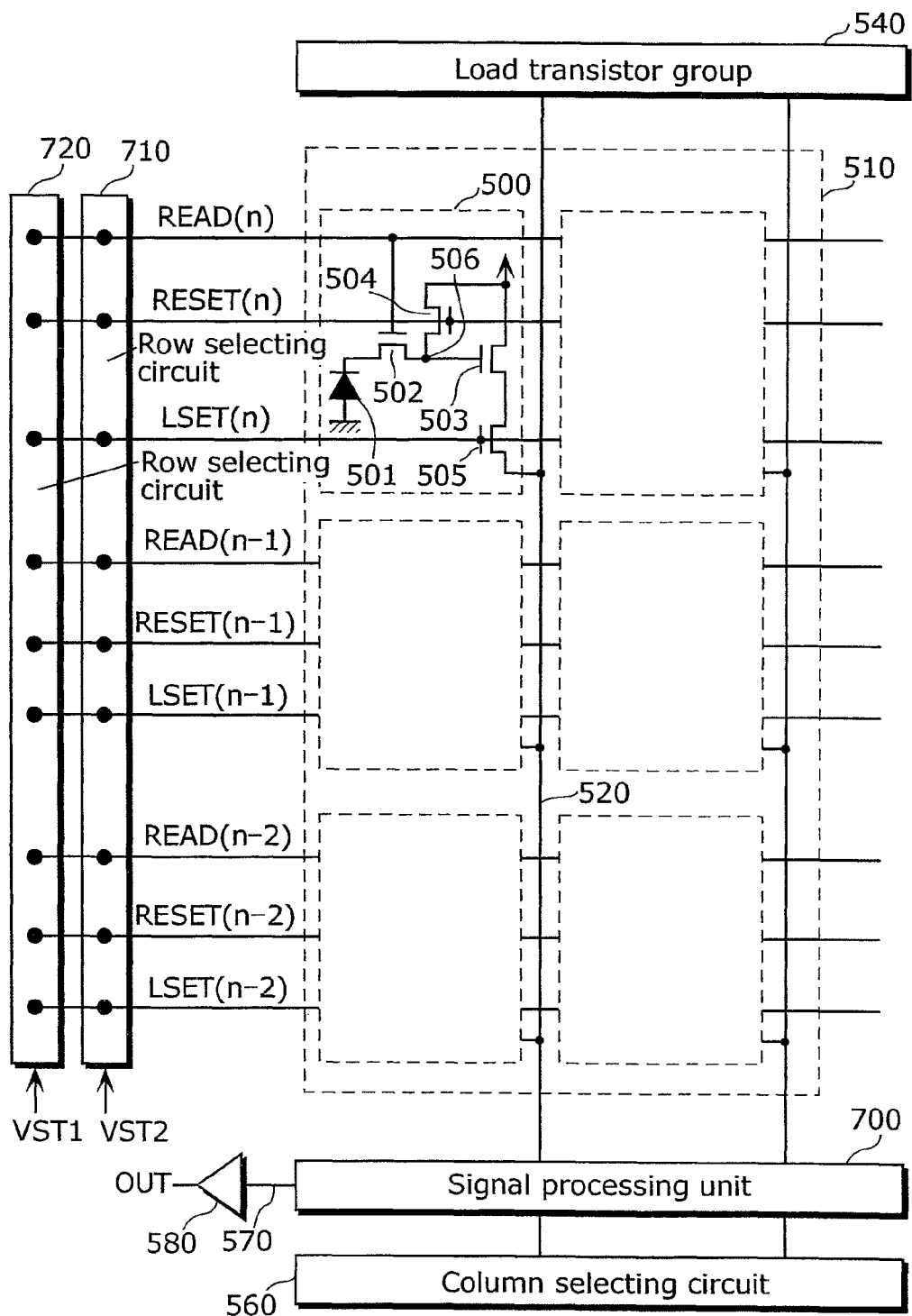
FIG. 9 shows a configuration of an amplification-type solid-state image pickup device according to a second embodiment of the present invention.

FIG. 9 shows a configuration of an amplification-type solid-state image pickup device according to a second embodiment. In FIG. 9, the elements which are the same as in FIG. 4 are assigned with the same reference numerals and their details are not explained again below.

The amplification-type solid-state image pickup device according to this embodiment has a signal processing unit and a row selecting circuit which are different from those of the solid-state image pickup device according to the first embodiment. The amplification-type solid-state image pickup device according to this embodiment includes a signal processing unit 700; row selecting circuits 710 and 720; unit cells 500; an image area 510; a first vertical signal line 520; a load transistor group 540; a column selecting circuit 560; a horizontal signal line 570; and an output amplifier 580.

Each of the row selecting circuits 710 and 720, which serves as a row selecting unit together with a vertical selection transistor 505, selects unit cells 500 in respective rows which are separated by two or more rows apart. Furthermore, the row selecting circuits 710 and 720, which serve as a read control unit, control periods of time during which signal charges are accumulated in the photodiode 501. Specifically, in a first mode, a first period shorter than one vertical scanning period and a second period shorter than the first period are set as accumulation time periods. In a second mode, a third period is set to be equal to one vertical scanning period as an accumulation time period. For example, the second period is longer than one horizontal period while the first period is set to the value obtained by subtracting the second period from one vertical scanning period.

Figure 10:
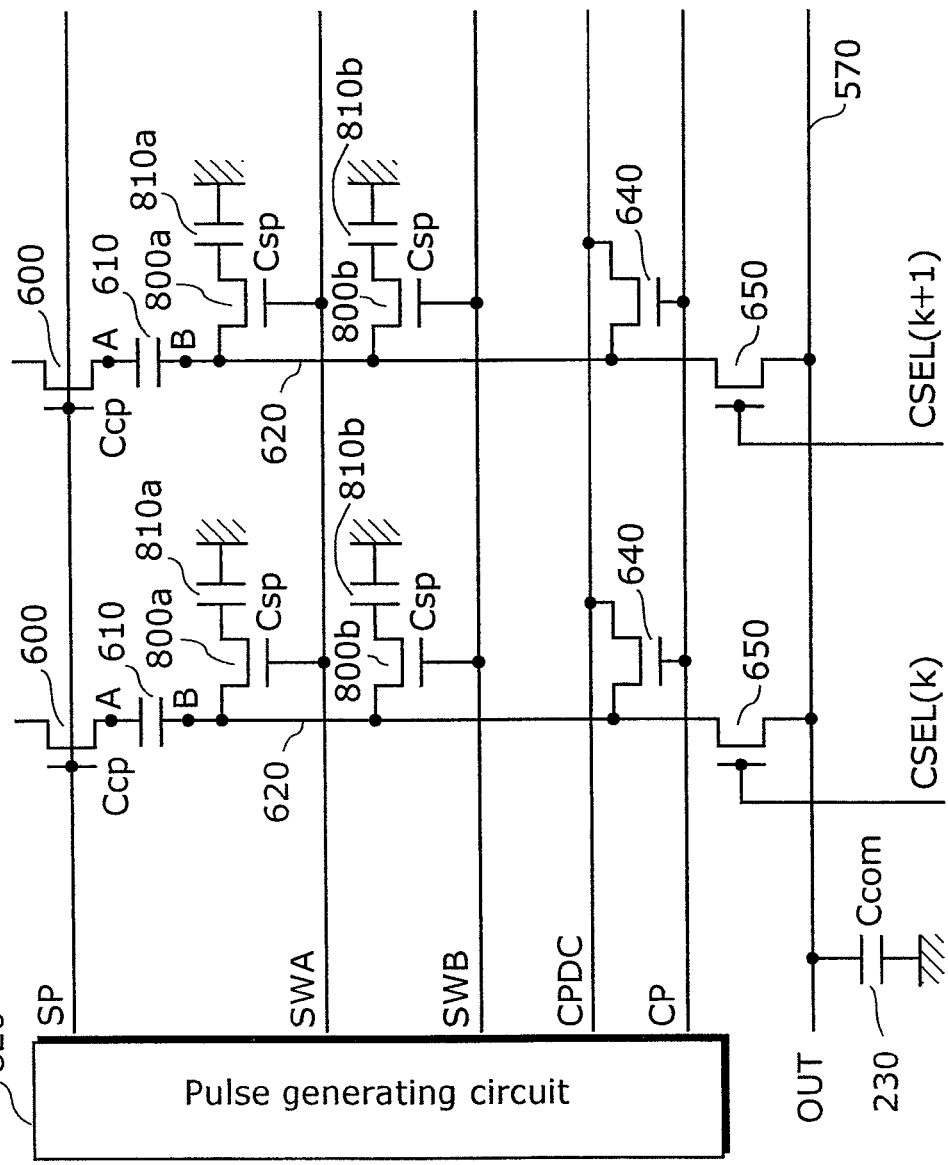
FIG. 10 shows a circuit structure of a signal processing unit of the amplification-type solid-state image pickup device according to the second embodiment.

FIG. 10 shows a circuit structure of the signal processing unit 700. In FIG. 10, the elements which are the same as in FIG. 5 are assigned with the same reference numerals and their details are not explained again below.

The signal processing unit 700 includes sampling transistors 800a and 800b; a sampling capacitor 810a connected to a second vertical signal line 620 through the sampling transistor 800a; a sampling capacitor 810b connected to the second vertical signal line 620 through the sampling transistor 800b; a pulse generating circuit 820; a sample/hold transistor 600; a clamping capacitor 610; the second vertical signal line 620; a clamping transistor 640; a column selecting transistor 650; and a horizontal signal line capacitor 230.

When a capacitor selection pulse is applied to set a SWA line High, the sampling transistor 800a is turned ON. Thereby, the sampling transistor 800a transfers the signal voltage transmitted from the second vertical signal line 620 to the sampling capacitor 810a, or transfers the signal voltage of the sampling capacitor 810a to the second vertical signal line 620. Furthermore, when a capacitor selection pulse B is applied to set a SWB line High, the sampling transistor 800b is turned ON. Thereby the sampling transistor 800b transfers the signal voltage transmitted from the second vertical signal line 620 to the sampling capacitor 810b, or transfers the signal voltage of the sampling capacitor 810b to the second vertical signal line 620.

In the first mode, the sampling capacitors 810a and 810b accumulate the signal voltages corresponding to the signal charges accumulated in the photodiode 501 during the first and second periods. In the second mode, the sampling capacitors 810a and 810b accumulate the signal voltage corresponding to the signal charges accumulated in the photodiodes 501 in rows different from each other during the third period, respectively. In this case, a capacitance value of the sampling capacitor 810a is represented as "Csp", and a capacitance value of the sampling capacitor 810b as "Csp".

The pulse generating circuit 820, which serves as a capacitor selection unit together with the sampling transistors 800a and 800b, selects an arbitrary sampling capacitor for accumulating a signal voltage therein out of the sampling capacitors 810a and 810b. Specifically, in the first mode, one of the sampling capacitors is selected so that the signal voltage corresponding to the signal charges accumulated during the first period is accumulated in the sampling capacitor 810a while the signal voltage corresponding to the signal charges accumulated during the second period is accumulated in the sampling capacitor 810b. In the second mode, one of the sampling capacitors is selected so that the signal voltage corresponding to the signal charges accumulated during the third period is accumulated in either one of the sampling capacitors 810a and 810b. Furthermore, the pulse generating circuit 820 selects one of the sampling capacitors so that the signal voltages accumulated in the sampling capacitors 810a and 810b are separately read out to the horizontal signal line 570.

Figure 11:
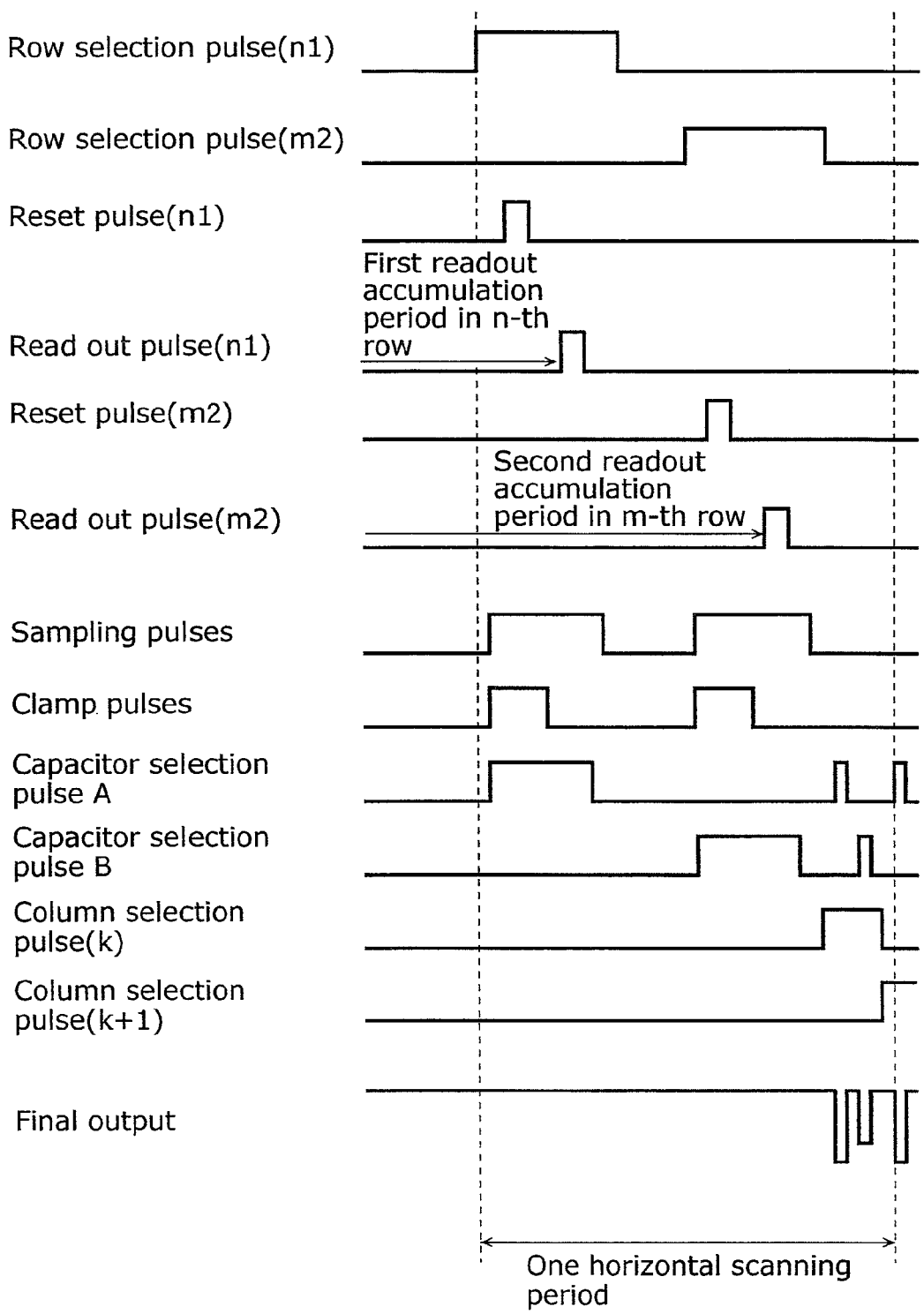
FIG. 11 is a driving timing chart showing an operation (first mode operation) of the amplification-type solid-state image pickup device according to the second embodiment.

Hereinafter, a description is given for an operation (first mode operation) of the amplification-type solid-state image pickup device thus configured with reference to the driving timing chart shown as FIG. 11. The second mode operation according to this embodiment is the same as in the amplification-type solid-state image pickup device according to the first embodiment, so its description is omitted here.

First, as the unit cells 500 in the n-th row are selected, a row selection pulse (n1) for setting a LSET(n) line High is applied from the row selecting circuit 710 to the vertical selection transistor 505 of each unit cell 500 in the n-th row. Thereby, each of the vertical selection transistors 505 is turned ON. A source follower circuit is formed by the amplification transistor 503 and the load transistor group 540. The voltage of each unit cell 500 depending on the supply voltage is output from the source follower circuit to the first vertical signal line 520.

Next, sampling pulses for setting a SP line High are applied so that the voltage output from the source follower circuit to the first vertical signal line 520 is held in the clamping capacitor 610. Since the clamp pulse for setting the CP line High is applied at the same time, at the side of the clamping capacitor 610 which is connected to the second vertical signal line 620 is reset to the potential of a CPDC line. Furthermore, since the capacitor selection pulse A for setting the SWA line High is applied at the same time, the sampling transistor 800a is turned ON so as to reset the sampling capacitor 810a to the CPDC line potential.

Next, a reset pulse (n1) for setting a RESET(n) line High is applied from the row selecting circuit 710 to the reset transistor 504 of each unit cell 500 in the n-th row so as to reset the potential of the FD unit 506.

Next, a clamp pulse for setting the CP line Low is applied so that the second vertical signal line 620 becomes a floating state.

Next, a read out pulse (n1) for setting a READ(n) line High is applied from the row selecting circuit 710 to the read transistor 502 of each unit cell 500 in the n-th row. The signal charges accumulated in the photodiode 501 are transferred to the FD unit 506. The gate voltage of the amplification transistor 503 connected to the FD unit 506 becomes the potential of the FD unit 506. A voltage substantially equal to this voltage is output to the first vertical signal line 520. Since the clamp pulse for setting the CP line Low is applied at the same time, the signal voltage of each of the unit cells 500 in the n-th row of the first period is accumulated in the sampling capacitor 810a. A capacitor selection pulse A for setting the SWA line Low is applied. A read out pulse (n1) for setting the READ(n) line Low is also applied.

In this case, the signal voltage of the first period to be accumulated in the sampling capacitor 810a corresponds to the signal charges accumulated in the photodiode 501 after a read out pulse (n2) for setting the READ(n) line High is applied from the row selecting circuit 720 so as to read the signal voltage of the second periods of the unit cells 500 in the n-th row, until a read out pulse (n1) for setting the READ(n) line High is applied from the row selecting circuit 710 this time so as to read the signal voltage of the first period of each of the unit cells 500 in the n-th row.

Next, as the unit cells 500 in the m-th row are selected, a row selection pulse (m2) for setting a LSET(m) line High is applied from the row selecting circuit 720 to the vertical selection transistor 505 of each of the unit cells 500 in the m-th row. Thereby, each of the vertical selection transistors 505 is turned ON. A source follower circuit is formed by the amplification transistor 503 and the load transistor group 540. The voltage of each unit cell 500 depending on the supply voltage is output from the source follower circuit to the first vertical signal line 520.

Next, a clamp pulse for setting a SP line High and sampling pulses for setting the CP line High are applied. Since the capacitor selection pulse B is applied to set the SWB line High at the same time, the sampling transistor 800b is turned ON so as to reset the sampling capacitor 810b to the CPDC line potential.

Next, a reset pulse (m2) for setting a RESET(m) line connected to the reset transistor 504 of each of the unit cells 500 in the m-th row High, is applied from the row selecting circuit 720 so as to reset the potential of the FD unit 506.

Next, a clamp pulse for setting the CP line Low is applied. The second vertical signal line 620 becomes a floating state.

Next, a read out pulse (m2) for setting a READ(m) line connected to the read transistor 502 of each of the unit cells 500 in the m-th row High, is applied from the row selecting circuit 720 so that the signal charges accumulated in the photodiode 501 is transferred to the FD unit 506. The gate voltage of the amplification transistor 503 connected to the FD unit 506 becomes the potential of the FD unit 506. A voltage substantially equal to this voltage is output to the first vertical signal line 520. Since the clamp pulse for setting the CP line Low is applied at the same time, the signal voltage of the second period of each of the unit cells 500 in the m-th row is accumulated in the sampling capacitor 810b. A capacitor selection pulse B for setting the SWB line Low is then applied.

In this case, the signal voltage of the second period to be accumulated in the sampling capacitor 810b corresponds to the signal charges accumulated in the photodiode 501 after a read out pulse (m1) for setting the READ(m) line High is applied from the row selecting circuit 710 so as to accumulate the signal voltage of the first period of each of the unit cells 500 in the m-th row, until a read out pulse (m2) for setting the READ(m) line High is applied from the row selecting circuit 720 this time so as to read out the signal voltage of the second period of each of the unit cells 500 in the m-th row.

Next, a column selection pulse (k) for setting a CSEL(k) line High is applied. The column selecting transistors 650 in the k-th column is turned ON. After that, a capacitor selection pulse A for setting the SWA line High is applied so that the signal voltage accumulated in the sampling capacitor 810a is output to the horizontal signal line 570. Further after that, a capacitor selection pulse B for setting the SWB line High is applied so that the signal voltage accumulated in the sampling capacitor 810*b* is output to the horizontal signal line 570.

Next, a column selection pulse, a capacitor selection pulse A, and a capacitor selection pulse B are applied to all the column selecting transistors 650.

As has been described above, the amplification-type solid-state image pickup device according to this embodiment, similarly to the amplification-type solid-state image pickup device according to the first embodiment, achieves a wider dynamic range.

Furthermore, the amplification-type solid-state image pickup device according to this embodiment, similarly to the amplification-type solid-state image pickup device according to the first embodiment, can be applied to various imaging conditions.

Furthermore, the amplification-type solid-state image pickup device according to this embodiment, differently from the amplification-type solid-state image pickup device according to the first embodiment, sets shorter one of the first and second periods to have duration longer than one horizontal period so as to set accumulation time periods with a high degree of flexibility.

Figure 12:
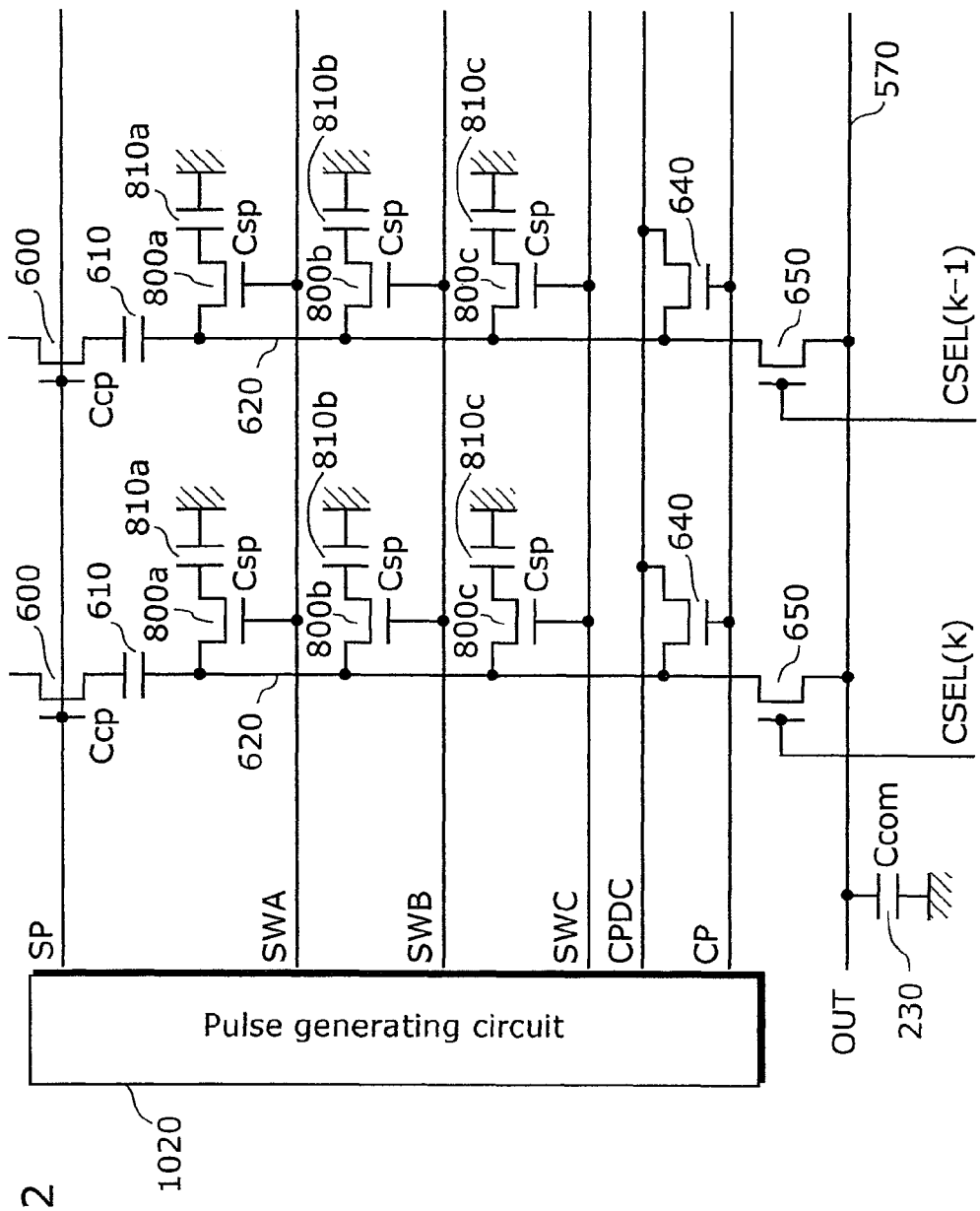
FIG. 12 is a circuit structure of a signal processing unit of an amplification-type solid-state image pickup device according to the second embodiment, to which a modification is made.

The amplification-type solid-state image pickup device according to this embodiment relates to the case in which the two sampling capacitors 810*a* and 810*b* are connected to the second vertical signal line 620 through the sampling transistors 800*a* and 800*b* so that one of the sampling capacitors is used for the signal voltage accumulation during the first and second periods, respectively. However, the configuration may be such that a plurality of sampling capacitors are connected to the second vertical signal line 620 so that the plurality of sampling capacitors are used for the signal voltage accumulation during the first and second periods, respectively. For example, as shown in FIG. 12, three sampling capacitor 810*a*, 810*b*, and 810*c* are connected to a second vertical signal line 620 through sampling transistors 800*a*, 800*b* and 800*c* so that one sampling capacitor or two may be used for the signal voltage accumulation during the first and second periods.

In this case, the number of sampling capacitors to be used for the signal voltage accumulation during the first period, and the number of sampling capacitors to be used for the signal voltage accumulation during the second period are optimized as follows.

The signal voltages corresponding to the signal charges accumulated in the photodiode 501 during the first period (t1) and the second period (t2) are represented as "SIG 1" and "SIG 2", respectively. The signal ratio is represented by: SIG 1: SIG 2=t1:t2. Let us take an example in which a constant noise of "N" is emitted in a latter stage of the circuit including the output amplifier 580. The S/N ratio (noise-to-signal ratio) of the second period signal is decreased in proportion to the signal of the first period with "t2/t1". Therefore, in order to make the S/N ratios of the first period signal and the second period signal equal to each other, it is preferable to optimize the capacitance value of the sampling capacitor for accumulating a signal voltage during each period.

Based on the above description, Equation (1) is derived, which optimizes the capacitance value "Csp1" of the sampling capacitor used for accumulating the signal voltage of the first period, and the capacitance value "Csp2" of the sampling capacitor used for accumulating the signal voltage of the second period. In Equation (1), the left side is given by multiplying the gain of the signals obtained during the first period by the first period duration, while the right side is given by multiplying the gain of the signals obtained during the second period by the second period duration. Equation (1) means that, since their S/N ratios are equal to each other as mentioned above, the signal outputs become also equal.

$$t1 \times (Ccp/(Ccp+Csp1))/(Csp1/(Csp1+Ccom)) = t2 \times (Ccp/(Ccp+Csp2))/(Csp2/(Csp2+Ccom)) \quad (1)$$

Figure 13:
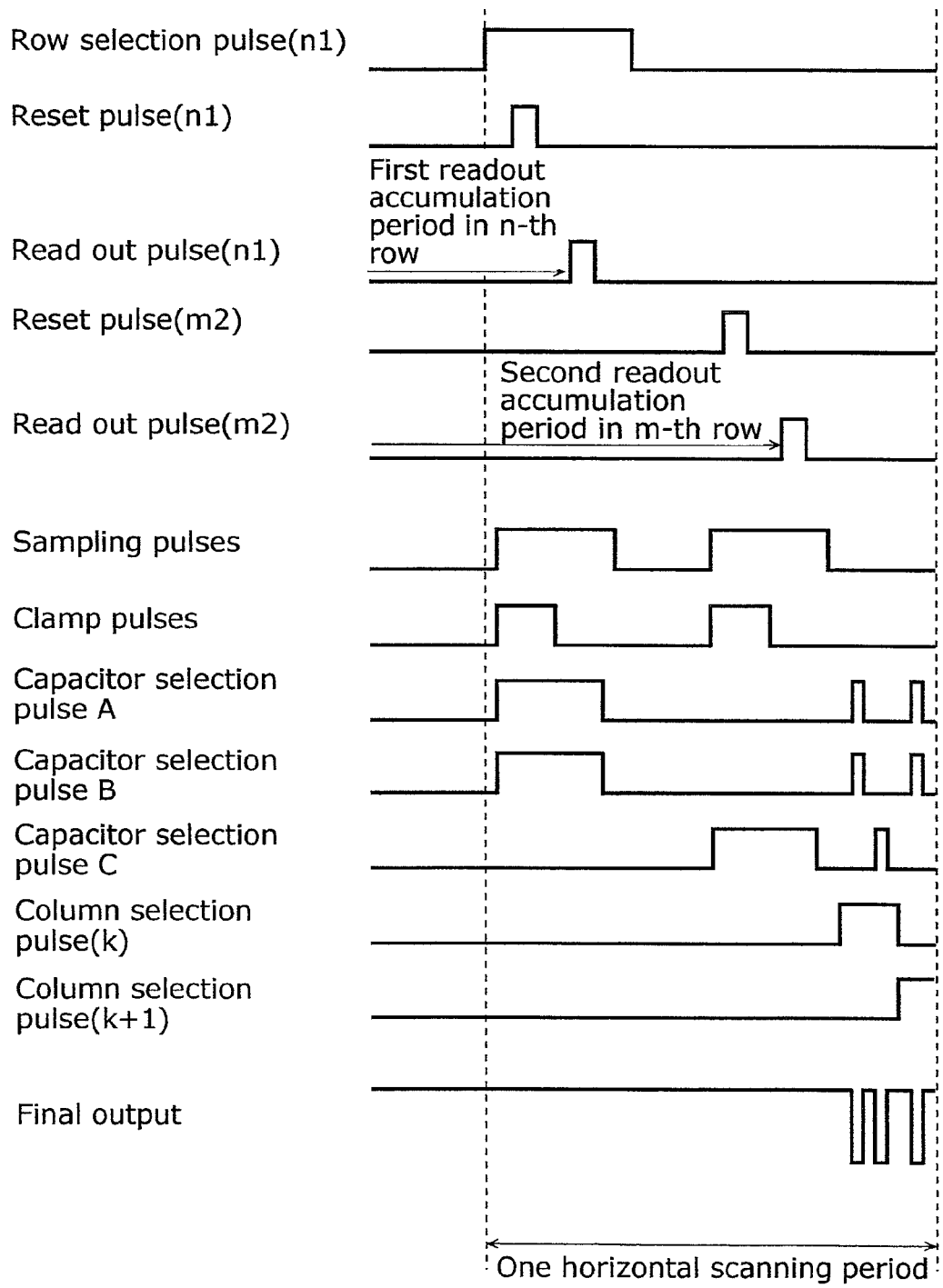
FIG. 13 is a driving timing chart showing an operation (first mode operation) of the modified amplification-type solid-state image pickup device according to the second embodiment.
Figure 14:
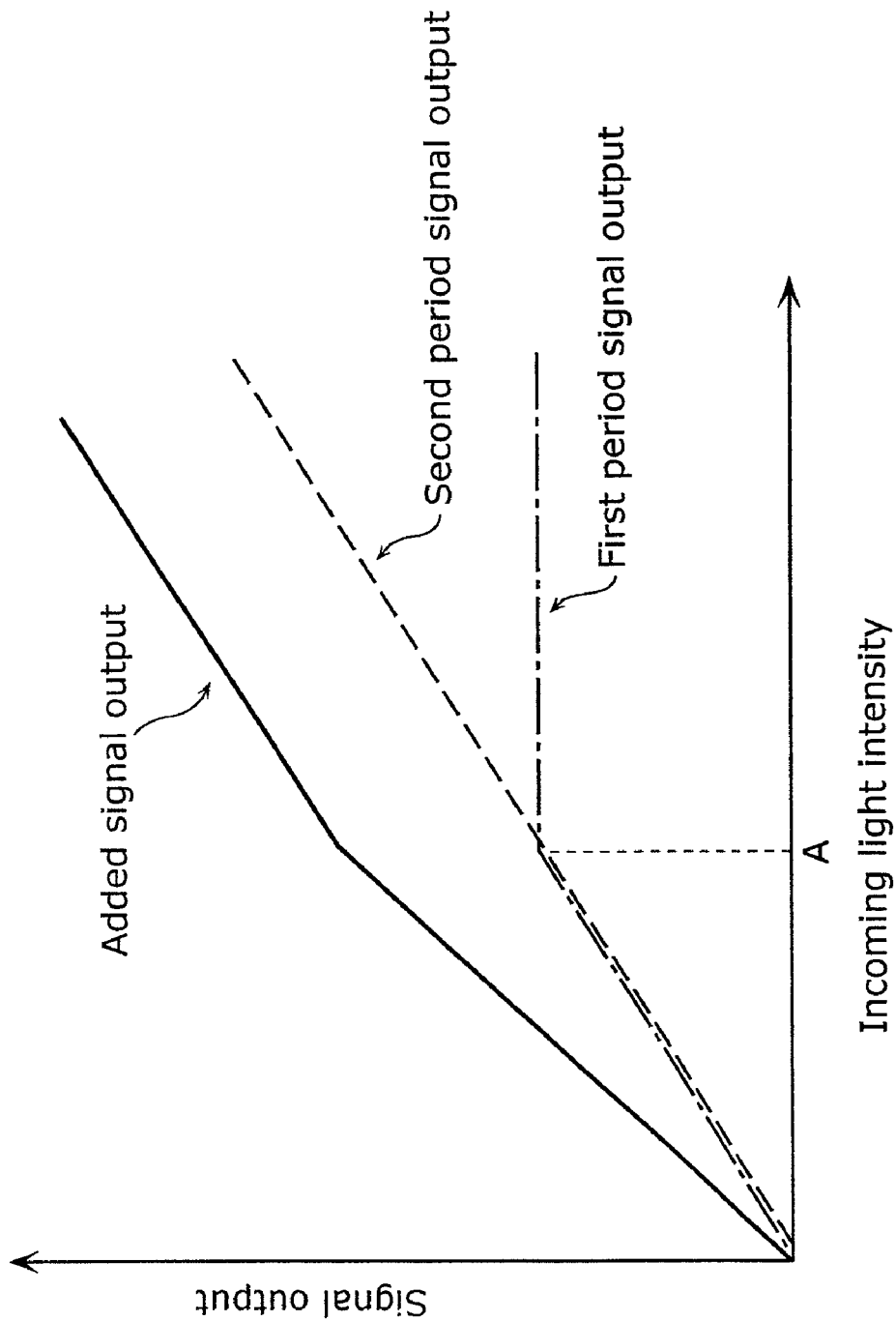
FIG. 14 is figure showing characteristics between incoming light intensity and signal output in the modified amplification-type solid-state image pickup device according to the second embodiment.

The optimal number of sampling capacitors used for accumulating the signal voltage of the first period, and the optimal number of sampling capacitors used for accumulating the signal voltage of the second period are calculated by Equation (1). Let us take an example in which both the values "Ccp" and "Ccom" are equal to 5 pF. From Equation (1), t1/t2=Csp1/Csp2. For example, if t1:t2=2:1, then Csp1=2Csp2. Therefore, in the signal processing unit 700 shown in FIG. 12, the optimal numbers of sampling capacitors used for accumulating the first and signal voltage of the second periods are equal to one and two respectively. The operation is shown in the driving timing chart of FIG. 13. Specifically, the pulse generating circuit 1020 selects a sampling capacitor so that the signal voltage corresponding to the signal charges accumulated during the first period is accumulated in the sampling capacitors 810*a* and 810*b*, while the signal voltage corresponding to the signal charges accumulated during the second period is accumulated in the sampling capacitor 810*c*. The pulse generating circuit 1020 selects a sampling capacitor also so that the signal voltages accumulated both in the sampling capacitors 810*a* and 810*b* and in the sampling capacitor 810*c* are separately read out to the horizontal signal line 570. In this case, each of the first and second period signals and their added output are shown in FIG. 14.

In this case, for example, if "t1:t2=5:1", then "Csp1=5Csp2". This means that it is impossible to distribute sampling capacitors optimally to have the same S/N ratio in the signal processing unit 700, which includes only three sampling capacitors as shown in FIG. 12. In this case, however, on the assumption that at least one sampling capacitor is used for accumulating the signal voltage for the respective accumulation time periods different from each other, with the signal having a higher voltage accumulated for longer duration as a standard, sampling capacitors are distributed so that the gain of a signal accumulated for longer duration is higher than the gain of a signal accumulated for shorter duration.

Figure 15:
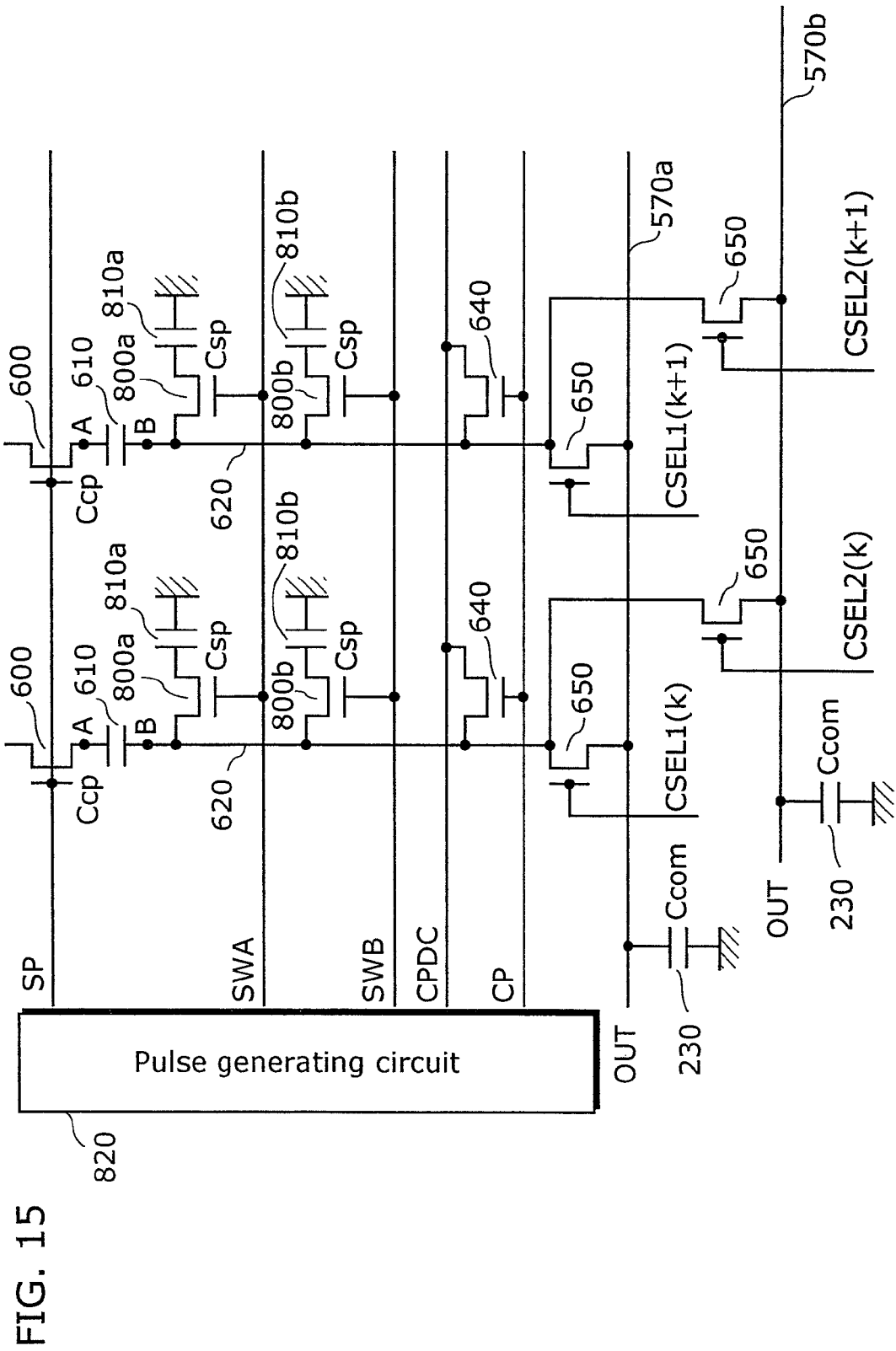
FIG. 15 is another circuit structure of the signal processing unit of the modified amplification-type solid-state image pickup device according to the second embodiment.
Figure 16:
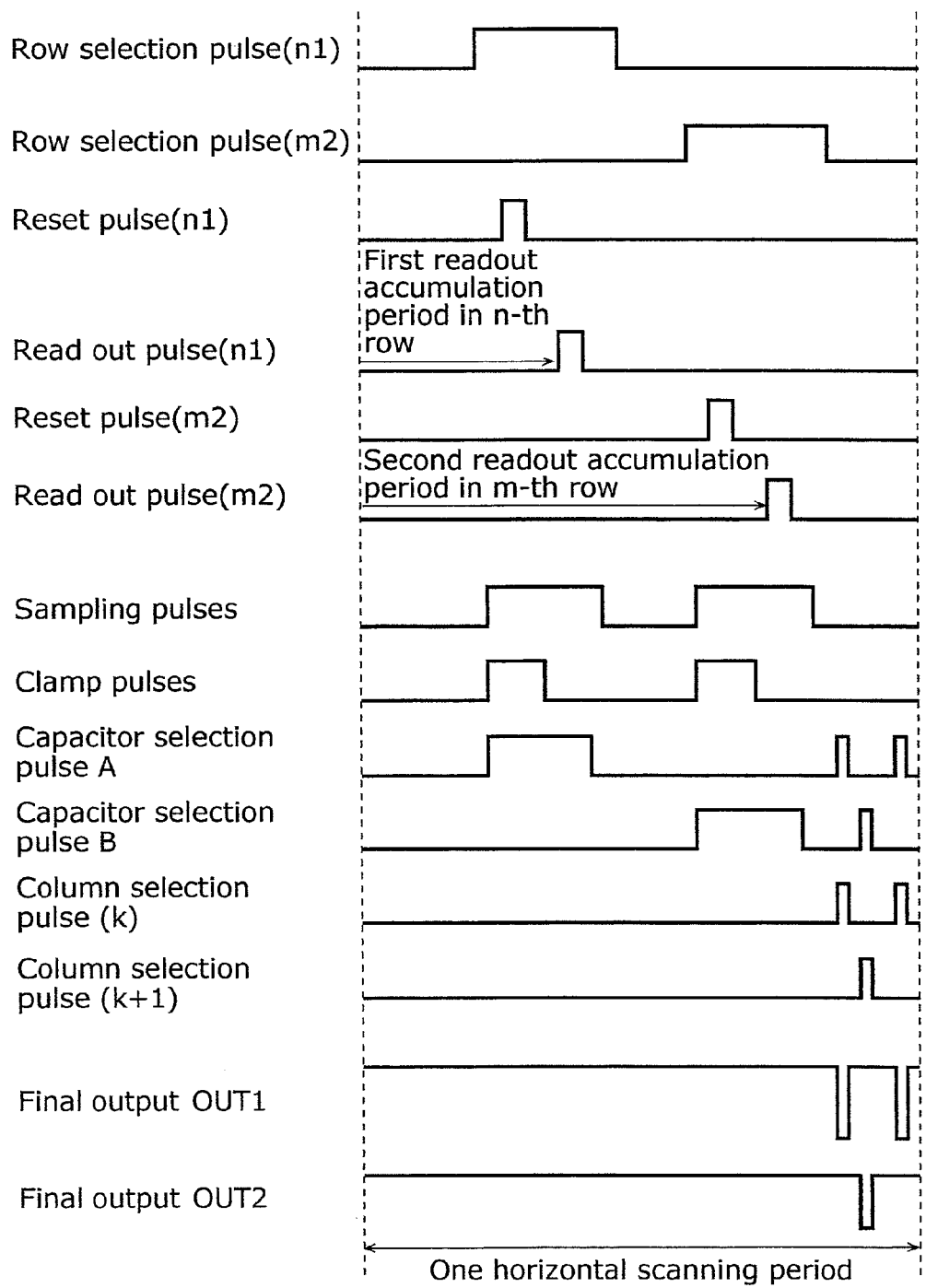
FIG. 16 is a driving timing chart showing another operation (first mode operation) of the modified amplification-type solid-state image pickup device according to the second embodiment.

Furthermore, the amplification-type solid-state image pickup device according to this embodiment relates to the case in which the plurality of second vertical signal lines 620 each are connected to one horizontal signal line 570 through the column selecting transistor 650. However, a plurality of second vertical signal lines each may be connected through a column selecting transistor to a plurality of horizontal signal lines. For example, as shown in FIG. 15, a plurality of second vertical signal lines 620 may be connected to two of a first horizontal signal line 570*a* and a second horizontal signal line 570*b* respectively through a column selecting transistor 650. In this case, the amplification-type solid-state image pickup device operates as shown in the driving timing chart of FIG. 16. In response to the application of a column selection pulse (k1) for setting a CSEL1 (k) High, a sampling capacitor 810*a* gets connected to a first horizontal signal line 570*a*. In response to the application of a column selection pulse (k2) for setting a CSEL2 (k) High, a sampling capacitor 810*b* gets connected to a second horizontal signal line 570*b*. Specifically, the signal voltages accumulated in the sampling capacitors 810*a* and 810*b* are separately outputted, without being added together in a horizontal signal line.

(Third Embodiment)

Figure 17:
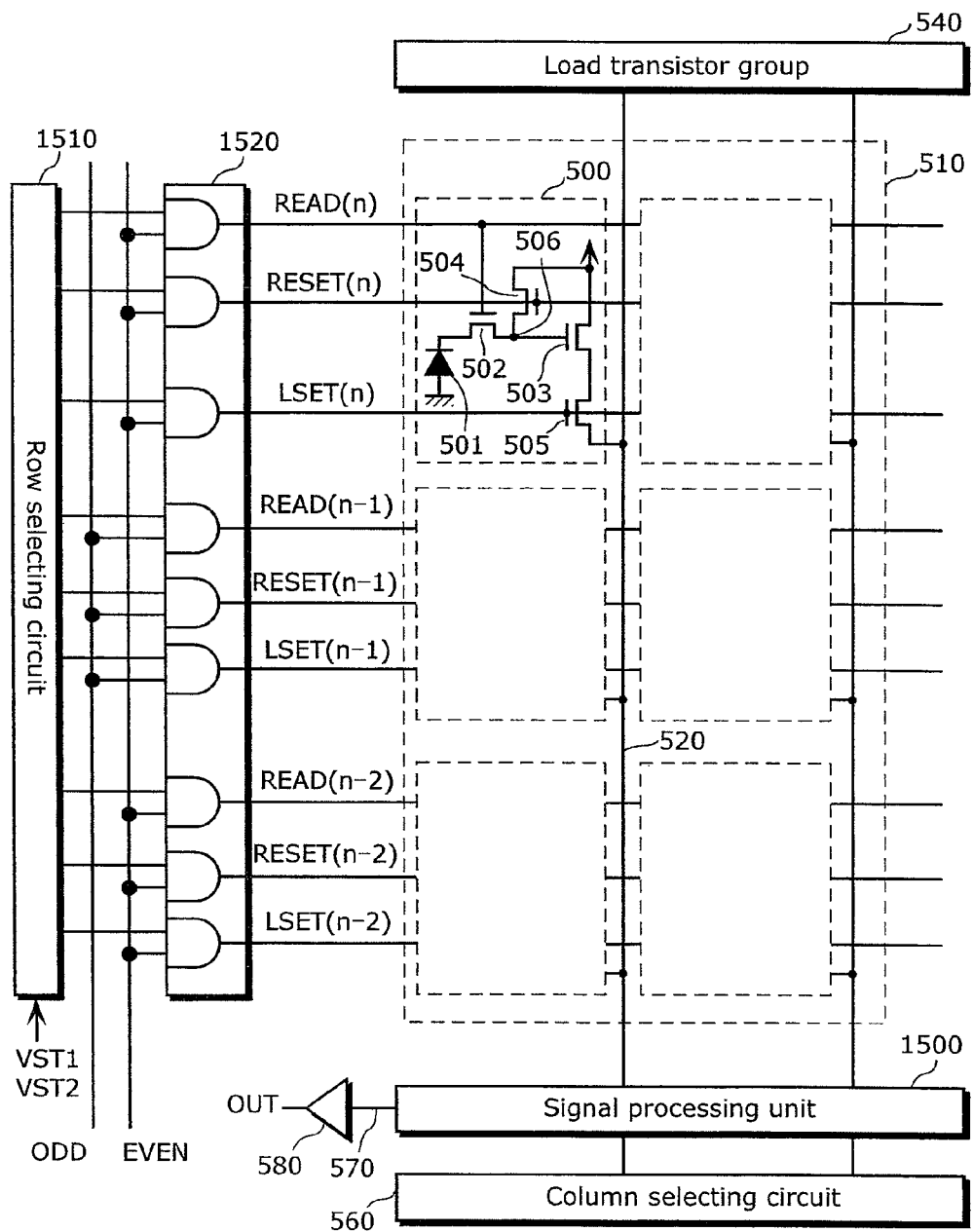
FIG. 17 shows a configuration of an amplification-type solid-state image pickup device according to a third embodiment of the present invention.

FIG. 17 shows a configuration of an amplification-type solid-state image pickup device according to a third embodiment. In FIG. 17, the elements which are the same as in FIG.

9 are assigned with the same reference numerals and their details are not explained again below.

The amplification-type solid-state image pickup device according to this embodiment has a signal processing unit and a row selecting circuit which are different from those of the solid-state image pickup device according to the second embodiment. The amplification-type solid-state image pickup device according to this embodiment includes a signal processing unit 1500; a row selecting circuit 1510; unit cells 500; a logic circuit 1520 having a plurality of AND gates connected to the unit cells 500 in each row; an image area 510; a first vertical signal line 520; a load transistor group 540; a column selecting circuit 560; a horizontal signal line 570; and an output amplifier 580.

The row selecting circuit 1510 and the logic circuit 1520, which serves as a row selecting unit together with a vertical selection transistor 505, select unit cells 500 in respective rows which are separated by two or more rows apart. Furthermore, the row selecting circuit 1510 and the logic circuit 1520, which serves as a read control unit, control periods of time during which signal charges are accumulated in the photodiode 501. Specifically, in a first mode, a first period shorter than one vertical scanning period, and a second period shorter than the first period are set as accumulation time periods. In a second mode, a third period is set to be equal to one vertical scanning period as an accumulation time period. For example, the second period is longer than one horizontal period while the first period is set to the value obtained by subtracting the second period from one vertical scanning period.

Figure 18:
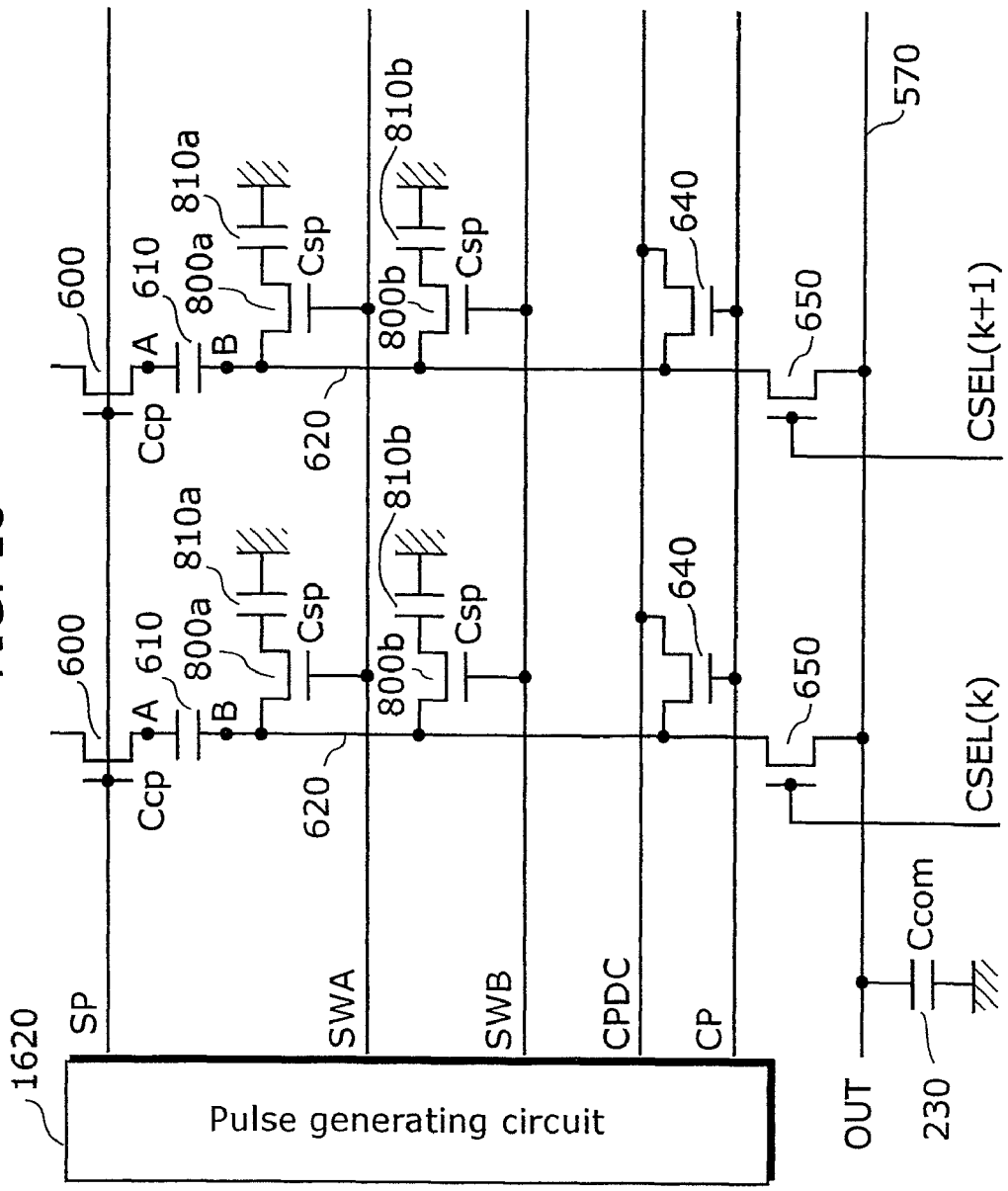
FIG. 18 shows a circuit structure of a signal processing unit of the amplification-type solid-state image pickup device according to the third embodiment.

FIG. 18 shows a circuit structure of the signal processing unit 1500. In FIG. 18, the elements which are the same as in FIG. 10 are assigned with the same reference numerals and their details are not explained again below.

The signal processing unit 1500 includes sampling transistors 800a and 800; sampling capacitors 810a and 810b; a sample/hold transistor 600; a clamping capacitor 610; a second vertical signal line 620; a clamping transistor 640; a column selecting transistor 650; a pulse generating circuit 1620; and a horizontal signal line capacitor 230.

The pulse generating circuit 1620, which serves as a capacitor selection unit together with the sampling transistors 800a and 800b, selects an arbitrary sampling capacitor for accumulating a signal voltage therein out of the sampling capacitors 810a and 810b. Specifically, in the first mode, one of the sampling capacitors is selected so that the signal voltage corresponding to the signal charges accumulated during the first period is accumulated in the sampling capacitor 810a, while the signal voltage corresponding to the signal charges accumulated during the second period is accumulated in the sampling capacitor 810b. In the second mode, one of the sampling capacitors is selected so that the signal voltage corresponding to the signal charges accumulated during the third period is accumulated in either one of the sampling capacitors 810a and 810b. Furthermore, the pulse generating circuit 1620 selects one of the sampling capacitors so that the signal voltages accumulated in the sampling capacitors 810a and 810b are separately read out to the horizontal signal line 570.

Figure 19:
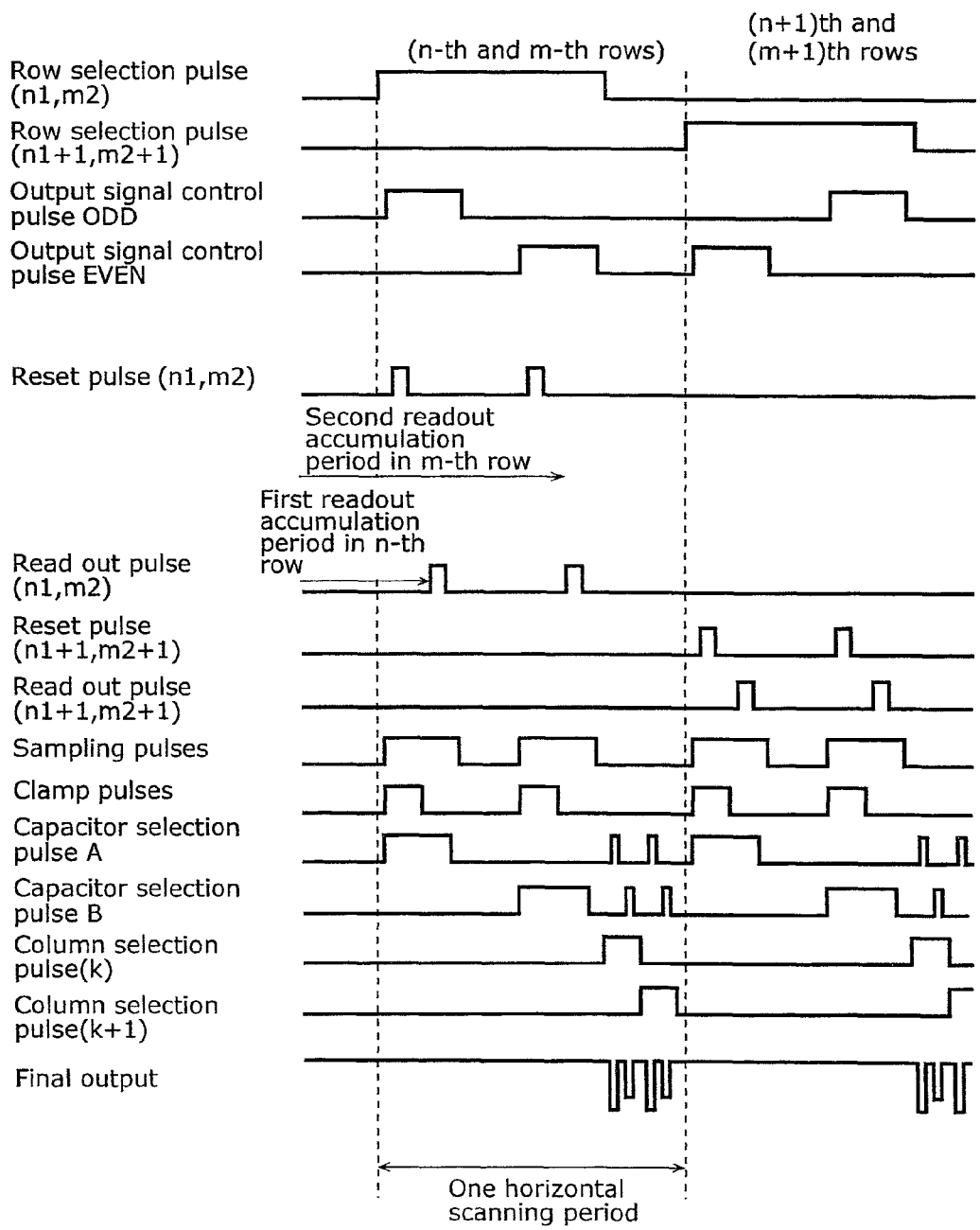
FIG. 19 is a driving timing chart showing an operation (first mode operation) of the amplification-type solid-state image pickup device according to the third embodiment.

Hereinafter, a description is given for an operation (first mode operation) of the amplification-type solid-state image pickup device thus configured with reference to the driving timing chart shown as FIG. 19. The second mode operation according to this embodiment is the same as in the amplification-type solid-state image pickup device according to the first embodiment, so its description is omitted here.

First, the unit cells 500 in the n-th and m-th rows are selected, a row selection pulse (n1, m2) for setting LSET(n) and LSET(m) lines High is applied from the row selecting circuit 1510 to one input terminal of the AND gate connected to the unit cells 500 in the n-th and m-th rows each. In this case, the n-th row is an odd-numbered row while the m-th row is an even-numbered row.

Next, an output signal control pulse ODD for setting an ODD line High is applied to the logic circuit 1520. Note that the ODD line transmits a signal to the other input terminal of the AND gate connected to the unit cells 500 in the odd-numbered row. The logical product of the AND gate connected to the unit cells 500 in the n-th row becomes one. The pulse applied to the one input terminal of the AND gate, in other words, a row selection pulse (n1,m2) for setting the LSET(n) line High is applied to the vertical selection transistors 505 of unit cells 500 in the n-th row. Thereby, each of the vertical selection transistors 505 is turned ON. A source follower circuit is formed by the amplification transistor 503 and the load transistor group 540. The voltage of each unit cell 500 depending on the supply voltage is output from the source follower circuit to the first vertical signal line 520.

Next, sampling pulses for setting a SP line High are applied so that the voltage which has been output from the source follower circuit to the first vertical signal line 520 is held in the clamping capacitor 610. Since the clamp pulse for setting the CP line High is applied at the same time, at the side of the clamping capacitor 610 which is connected to the second vertical signal line 620 is reset to the potential of a CPDC line. Furthermore, since the capacitor selection pulse A for setting the SWA line High is applied at the same time, the sampling capacitor 810a is reset to the CPDC line potential.

Next, a reset pulse (n1, m2) for setting a RESET(n) line and a RESET(m) line High, is applied from the row selecting circuit 1510 to the one input terminal of the AND gate connected to the unit cells 500 in the n-th and m-th rows each. Since the output signal control pulse ODD for setting the ODD line High is applied to the other input terminal of the AND gate, the logical product of the AND gate connected to the unit cells 500 in the n-th row becomes one. A reset pulse (n1, m2) for setting the RESET(n) line High is applied to the reset transistor 504 of each unit cell 500 in the n-th row. The reset transistor 504 is turned ON so as to reset the potential of the FD unit 506.

Next, a clamp pulse for setting the CP line Low is applied, and the second vertical signal line 620 becomes a floating state. Next, a read out pulse (n1, m2) for setting the READ(n) line and the READ(m) line High, is applied from the row selecting circuit 1510 to the one input terminal of the AND gate connected to the unit cells 500 in the n-th and m-th rows each. Since the output signal control pulse ODD for setting the ODD line High is applied to the other input terminal of the AND gate, the logical product of the AND gate connected to the unit cells 500 in the n-th row becomes one. A read out pulse (n1, m2) for setting the READ(n) line High is then applied to the read transistor 502 of each unit cell 500 in the n-th row. The read transistor 502 is turned ON so as to transfer the signal charges accumulated in the photodiode 501 to the FD unit 506. The gate voltage of the amplification transistor 503 connected to the FD unit 506 becomes the potential of the FD unit 506. A voltage substantially equal to this voltage is output to the first vertical signal line 520. Since the clamp pulse for setting the CP line Low is applied at the same time, the signal voltage of the first period of each of the unit cells 500 in the n-th row is accumulated in the sampling capacitor 810a. A capacitor selection pulse A for setting the SWA line Low, and a read out pulse (n1, m2) for setting the READ(n)

line Low are then applied. An output signal control pulse ODD for setting the ODD line Low is further applied.

In this case, the signal voltage of the first period to be accumulated in the sampling capacitor 810a corresponds to the signal charges accumulated in the photodiode 501 after a read out pulse (n2, m1) for setting the READ(n) line High is applied so as to read out the signal voltage of the second period of each of the unit cells 500 in the n-th row, until a read out pulse (n1, m2) for setting the READ(n) line High is applied this time so as to read out the signal voltage of the first period of each of the unit cells 500 in the n-th row.

Next, an output signal control pulse EVEN for setting an EVEN line High, which transmits a signal to the other input terminal of the AND gate connected to the unit cells 500 in the even-numbered row, is applied to the logic circuit 1520. The logical product of the AND gate connected to each of the unit cells 500 in the m-th row becomes one. The pulse applied to the one input terminal of the AND gate, in other words, a row selection pulse (n1, m2) for setting the LSET(m) line High, is applied to the vertical selection transistor 505 of each of the unit cells 500 in the m-th row. Thereby, each of the vertical selection transistors 505 is turned ON. A source follower circuit is formed by the amplification transistor 503 and the load transistor group 540. The voltage of each unit cell 500 depending on the supply voltage is output from the source follower circuit to the first vertical signal line 520.

Next, sampling pulses for setting the SP line High are applied so that the voltage output from the source follower circuit to the first vertical signal line 520 is held in the clamping capacitor 610. Since the clamp pulse for setting the CP line High is applied at the same time, at the side of the clamping capacitor 610 which is connected to the second vertical signal line 620 is reset to the CPDC line potential. Furthermore, since the capacitor selection pulse B for setting the SWB line High is applied at the same time, the sampling capacitor 810b is reset to the CPDC line potential.

Next, a reset pulse (n1, m2) for setting the RESET(n) line and the RESET(m) line High, is applied from the row selecting circuit 1510 to the one input terminal of the AND gate connected to the unit cells 500 in the n-th and m-th rows each. Since the output signal control pulse EVEN for setting the EVEN line High is applied to the other input terminal of the AND gate at the same time, the logical product of the AND gate connected to each of the unit cells 500 in the m-th row becomes one. A reset pulse (n1, m2) for setting the RESET (m) line High is then applied to the reset transistor 504 of each of the unit cells 500 in the m-th row. The reset transistor 504 is turned ON so as to reset the potential of the FD unit 506.

Next, a clamp pulse for setting the CP line Low is applied, and the second vertical signal line 620 becomes a floating state. Next, a read out pulse (n1, m2) for setting the READ(n) line and the READ(m) line High, is applied to the one input terminal of the AND gate connected to the unit cells 500 in the n-th and m-th rows each. Since the output signal control pulse EVEN for setting the EVEN line High is applied to the other input terminal of the AND gate, the logical product of the AND gate connected to each of the unit cells 500 in the m-th row becomes one. A read out pulse (n1, m2) for setting the READ(m) line High is then applied to the read transistor 502 of each of the unit cells 500 in the m-th row. The read transistor 502 is turned ON so as to transfer the signal charges accumulated in the photodiode 501 to the FD unit 506. The gate voltage of the amplification transistor 503 connected to the FD unit 506 becomes the potential of the FD unit 506. A voltage substantially equal to this voltage is output to the first vertical signal line 520. Since the clamp pulse for setting the CP line Low is applied at the same time, the clamping transistor 640 is turned OFF, and the signal voltage of the second period of each of the unit cells 500 in the m-th row is accumulated in the sampling capacitor 810b. A capacitor selection pulse B for setting the SWB line Low, and a read out pulse (n1, m2) for setting the READ(m) line Low are then applied. An output signal control pulse EVEN for setting the EVEN line Low is further applied.

In this case, the signal voltage of the second period to be accumulated in the sampling capacitor 810b corresponds to the signal charges accumulated in the photodiode 501 after a read out pulse (n2, m1) for setting the READ(m)line High is applied so as to read out the signal voltage of the first period of each of the unit cells 500 in the m-th row, until a read out pulse (n1, m2) for setting the READ(m) line High is applied this time so as to read out the signal voltage of the second period of each of the unit cells 500 in the m-th row.

Next, a column selection pulse (k) for setting a CSEL(k) line High is applied, and the column selecting transistors 650 in the k-th column are turned ON. After that, a capacitor selection pulse A for setting the SWA line High is applied so that the signal voltage accumulated in the sampling capacitor 810a is output to the horizontal signal line 570. Further after that, a capacitor selection pulse B for setting the SWB line High is applied so that the signal voltage accumulated in the sampling capacitor 810b is output to the horizontal signal line 570.

Next, a column selection pulse, a capacitor selection pulse A, and a capacitor selection pulse B are applied for all the column selecting transistors 650.

Next, as the unit cells 500 in the (n+1)th row and the (m+1)th row are selected, a row selection pulse (n1+1, m2+1) for setting a LSET(n+1) line and an LSET(m+1) line High is applied from the row selecting circuit 1510 to the one input terminal of the AND gate connected to unit cells 500 in the (n+1)th and (m+1)th rows each. In this case, the (n+1)th row is an even-numbered row while the (m+1)th row is an odd-numbered row.

Next, an output signal control pulse EVEN for setting the EVEN line High is applied to the other input terminal of the AND gate. The logical product of the AND gate connected to each of the unit cells 500 in the (n+1)th row becomes one. A row selection pulse (n1+1, m2+1) for setting the LSET(n+1) line High is applied to the vertical selection transistor 505 of each of the unit cells 500 in the (n+1)th row. Thereby, each of the vertical selection transistors 505 is turned ON. A source follower circuit is formed by the amplification transistor 503 and the load transistor group 540. The voltage of each unit cell 500 depending on the supply voltage is output from the source follower circuit to the first vertical signal line 520.

Next, sampling pulses for setting the SP line High are applied to the sample/hold transistor 600 so that the voltage which has been output from the source follower circuit to the first vertical signal line 520 is held in the clamping capacitor 610. Since the clamp pulse for setting the CP line High is applied at the same time, at the side of the clamping capacitor 610 which is connected to the second vertical signal line 620 is reset to the potential of the CPDC line. Furthermore, since the capacitor selection pulse A for setting the SWA line High is applied at the same time, the sampling capacitor 810a is reset to the CPDC line potential.

Next, a reset pulse (n1+1, m2+1) for setting a RESET(n+1) line and a RESET(m+1) line High, is applied to the one input terminal of the AND gate connected to the unit cells 500 in the (n+1)th and (m+1)th rows each. Since the output signal control pulse EVEN for setting the EVEN line High is applied to the other input terminal of the AND gate at the same time, the logical product of the AND gate connected to each of the unit cells 500 in the (n+1)th row becomes one. A reset pulse (n1+1, m2+1) for setting the RESET(n+1) line High is applied to the reset transistor 504 of each of the unit cells 500 in the (n+1)th row. The reset transistor 504 is turned ON so as to reset the potential of the FD unit 506.

Next, a clamp pulse for setting the CP line Low is applied to the clamping transistor 640, and the second vertical signal line 620 becomes a floating state.

Next, a read out pulse (n1+1, m2+1) for setting a READ (n+1) line and a READ(m+1) line High, is applied from the row selecting circuit 1510 to the one input terminal of the AND gate connected to the unit cells 500 in the (n+1)th and (m+1)th rows each. Since the output signal control pulse EVEN for setting the EVEN line High is applied to the other input terminal of the AND gate at the same time, the logical product of the AND gate connected to each of the unit cells 500 in the (n+1)th row becomes one. A read out pulse (n1+1, m2+1) for setting the READ(n+1) line High is then applied to the read transistor 502 of each of the unit cells 500 in the (n+1)th row. The read transistor 502 is turned ON so as to transfer the signal charges accumulated in the photodiode 501 to the FD unit 506. The gate voltage of the amplification transistor 503 connected to the FD unit 506 becomes the potential of the FD unit 506. A voltage substantially equal to this voltage is output to the first vertical signal line 520. Since the clamp pulse for setting the CP line Low is applied to the clamping transistor 640 at the same time, the signal voltage of the first period of each of the unit cells 500 in the (n+1)th row is accumulated in the sampling capacitor 810a. A capacitor selection pulse A for setting the SWA line Low, and a read out pulse (n1+1, m2+1) for setting the READ(n+1) line Low are then applied. An output signal control pulse EVEN for setting the EVEN line Low is further applied.

In this case, the signal voltage of the first period to be accumulated in the sampling capacitor 810a corresponds to the signal charges accumulated in the photodiode 501 after a read out pulse (n2+1, m1+1) for setting the READ(n+1) line High is applied so as to read out the signal voltage of the second period of each of the unit cells 500 in the (n+1)th row, until a read out pulse (n1+1, m2+1) for setting the READ(n+1) line High is applied this time so as to read out the signal voltage of the first period of the (n+1)th unit cells 500.

Next, an output signal control pulse ODD for setting the ODD line High is applied to the other input terminal of the AND gate. The logical product of the AND gate connected to each of the unit cells 500 in the (m+1)th row becomes one. A row selection pulse (n1+1, m2+1) for setting the LSET(m+1) line High is applied to the vertical selection transistor 505 of each of the unit cells 500 in the (m+1)th row. Thereby, each of the vertical selection transistors 505 is turned ON. A source follower circuit is formed by the amplification transistor 503 and the load transistor group 540. The voltage of each unit cell 500 depending on the supply voltage is output from the source follower circuit to the first vertical signal line 520.

Next, sampling pulses for setting the SP line High are applied to the sample/hold transistor 600 so that the voltage output from the source follower circuit to the first vertical signal line 520 is held in the clamping capacitor 610. Since the clamp pulse for setting the CP line High is applied to the clamping transistor 640, at the side of the clamping capacitor 610 which is connected to the second vertical signal line 620 is reset to the potential of the CPDC line. Furthermore, since the capacitor selection pulse B for setting the SWB line High is applied at the same time, the sampling capacitor 810b is reset to the CPDC line potential.

Next, a reset pulse (n1+1, m2+1) for setting the RESET(n+1) and RESET(m+1) lines High, is applied to the one input terminal of the AND gate connected to the unit cells 500 in the (n+1)th and (m+1)th rows each. Since the output signal control pulse ODD for setting the ODD line High is applied to the other input terminal of the logic gate, the logical product of the AND gate connected to the unit cells 500 in the (m+1)th row becomes one. A reset pulse (n1+1, m2+1) for setting the RESET(m+1) line High is then applied to the reset transistor 504 of each of the unit cells 500 in the (m+1)th row. The reset transistor 504 is turned ON so as to reset the potential of the FD unit 506.

Next, a clamp pulse for setting the CP line Low is applied to the clamping transistor 640, and the second vertical signal line 620 becomes a floating state.

Next, a read out pulse (n1+1, m2+1) for setting the READ (n+1) and READ(m+1) lines High, is applied from the row selecting circuit 1510 to the one input terminal of the AND gate connected to the unit cells 500 in the (n+1)th and (m+1)th rows each. Since the output signal control pulse ODD for setting the ODD line High is applied to the other input terminal of the logic gate, the logical product of the AND gate connected to each of the unit cells 500 in the (m+1)th row becomes one. A read out pulse (n1+1, m2+1) for setting the READ(m+1) line High is then applied to the read transistor 502 of each of the unit cells 500 in the (m+1)th row. The read transistor 502 is turned ON so as to transfer the signal charges accumulated in the photodiode 501 to the FD unit 506. The gate voltage of the amplification transistor 503 connected to the FD unit 506 becomes the potential of the FD unit 506. A voltage substantially equal to this voltage is output to the first vertical signal line 520. Since the clamp pulse for setting the CP line Low is applied to the clamping transistor 640 at the same time, the signal voltage of the second period of each of the unit cells 500 in the (m+1)th row is accumulated in the sampling capacitor 810b. A capacitor selection pulse B for setting the SWB line Low, and a read out pulse (n1+1, m2+1) for setting the READ(m+1) line Low are then applied. An output signal control pulse ODD for setting the ODD line Low is further applied.

In this case, the signal voltage of the second period to be accumulated in the sampling capacitor 810b corresponds to the signal charges accumulated in the photodiode 501 after a read out pulse (n2+1, m1+1) for setting the READ(m+1) line High is applied so as to read out the signal voltage of the first period of each of the unit cells 500 in the (m+1)th row, until a read out pulse (n1+1, m2+1) for setting the READ(m+1) line High is applied this time so as to read out the signal voltage of the second period of each of the unit cells 500 in the (m+1)th row.

Next, a column selection pulse (k) for setting the CSEL(k) line High is applied, and the column selecting transistor 650 in the k-th column is turned ON. After that, a capacitor selection pulse A for setting the SWA line High is applied so that the signal voltage accumulated in the sampling capacitor 810a is output to the horizontal signal line 570. Further after that, a capacitor selection pulse B for setting the SWB line High is applied so that the signal voltage accumulated in the sampling capacitor 810b is output to the horizontal signal line 570.

Next, a column selection pulse, a capacitor selection pulse A, and a capacitor selection pulse B are applied for all the column selecting transistors 650.

As has been described above, the amplification-type solid-state image pickup device according to this embodiment, similarly to the amplification-type solid-state image pickup device according to the second embodiment, achieves a wider dynamic range.

Furthermore, the amplification-type solid-state image pickup device according to this embodiment, similarly to the amplification-type solid-state image pickup device according to the second embodiment, successfully sets accumulation time periods with a high degree of flexibility.

Furthermore, in the amplification-type solid-state image pickup device according to this embodiment, the logic circuit 1520 is provided between the row selecting circuit 1510 and the unit cells 500 so as to read out signal voltages in rows different from each other. Therefore, a shift register for generating a plurality of read out signals does not have to be provided. The amplification-type solid-state image pickup device according this embodiment achieves a wider dynamic range without increasing the chip size.

Although the amplification-type solid-state image pickup device according to the present invention has been described with respect to the above embodiments, the present invention is not limited to these cases. It should be understood that the foregoing and various other changes and modifications may be made therein without departing from the scope of the present invention.

Figure 20:
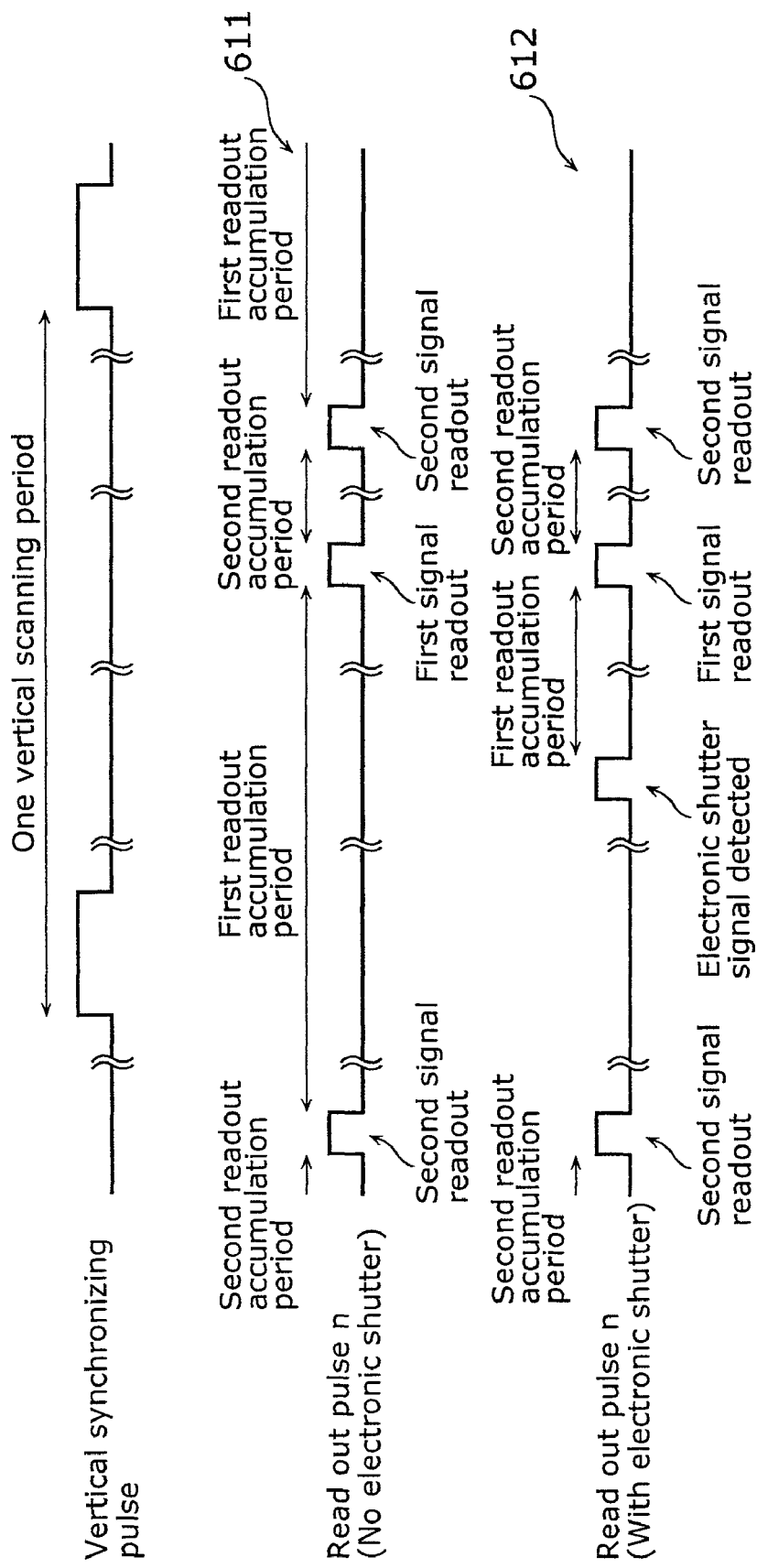
FIG. 20 illustrates how to set first and second periods discretionarily in the amplification-type solid-state image pickup device according to the third embodiment.

For example, as indicated by reference numeral 611 in the timing chart shown as FIG. 20, the above embodiment relates to the case in which the first and second periods are set by controlling the timing of applying a read out pulse in the first mode. However, the row selecting circuit may apply an electronic shutter pulse at an arbitrary timing so as to set the first and second periods by the electronic shutter pulse application timing. In this case, the first or second period runs after the electronic shutter pulse application until the application of a read out pulse for accumulating signal voltage of the first period or the second period. For example, as indicated by reference numeral 612 in the timing chart shown as FIG. 20, the first period runs after an electronic shutter pulse is applied until a read out pulse (n) is applied so as to accumulate the signal voltage of the first period. Furthermore, it goes without saying that the third period in the second mode may be set to be one vertical scanning period or shorter by employing an electronic shutter pulse.

Furthermore, the above embodiment relates to the case in which a capacitor selection pulse A and a capacitor selection pulse B are applied followed by the sequential application of column selection pulses (k) and (k+1). However, in order to add the signals accumulated in the capacitors together, a capacitor selection pulse A and a capacitor selection pulse B may be applied sequentially after the application of the column selection pulse (k).

Furthermore, in the above embodiment, the transistors and the capacitors, for example, may be N-type MOS transistors, which means the column selecting transistor is an N-type MOS transistor of lower on-resistance for selecting a column than a PMOS transistor. This downsizes the gate of the column selecting transistor, and reduces the impact of external noise caused by the column selecting transistor. In addition, since the capacitors are N-type MOS transistors, a quick response characteristic is obtained. Furthermore, it becomes possible to form the capacitor with one layered polysilicon, not with two layers made of polysilicon, thereby simplifying its manufacturing process.

Industrial Applicability

The present invention is applicable to solid-state image pickup devices, and more particularly to an image input element of mobile equipment such as a digital still camera.

The invention claimed is:

1. An amplification-type solid-state image pickup device, comprising:

a plurality of unit cells including (i) a photoelectric converter operable to convert light into signal charges and to accumulate the signal charges, and (ii) a reader operable to read the signal charges from said photoelectric converter, said unit cells being arranged by rows and columns, each of said unit cells being operable to output amplified signals corresponding to the signal charges;

a read controller operable to control said reader to read the signal charges accumulated during a first period and a second period, said first period and said second period being accumulation time periods different from each other;

a row selector operable to select a row;

a first capacitor element and a second capacitor element which are connected to each of the columns of said unit cells; and a capacitor selector operable to select one of said first capacitor element and said second capacitor element, wherein said capacitor selector is operable to perform a selecting, so that the amplified signals corresponding to the signal charges accumulated during the first period and the second period are accumulated into said first capacitor element and said second capacitor element, respectively, and said capacitor selector is operable to perform the selecting so that signal-to-noise ratios of the amplified signals accumulated in said first capacitor element and said second capacitor element become similar.

2. The solid-state image pickup device according to claim 1, wherein said first capacitor element and said second capacitor element have capacitance values different from each other.

3. The solid-state image pickup device according to claim 1, wherein said capacitor selector is operable to perform the selecting based on a ratio between the first period and the second period.

4. An amplification-type solid-state image pickup device, comprising:

a plurality of unit cells including (i) a photoelectric converter operable to convert light into signal charges and to accumulate the signal charges, and (ii) a reader operable to read the signal charges from said photoelectric converter, said unit cells being arranged by rows and columns, each of said unit cells being operable to output amplified signals corresponding to the signal charges;

a read controller operable to control said reader to read the signal charges accumulated during a first period and a second period, said first period and second period being accumulation time periods different from each other; and a row selector operable to select a row, wherein said row selector is operable to sequentially select two rows which are separated by at least two rows, said read controller is operable to control said reader to read the signal charges accumulated during the first period when the signal charges are read from said unit cells in one of the at least two rows, and to control said reader to read the signal charges accumulated during the second period when the signal charges are read from said unit cells in an other row.

5. The solid-state image pickup device according to claim 4, wherein said row selector includes a select circuit operable to control the selecting of the two rows which are separated by at least two rows.

6. The solid-state image pickup device according to claim 4, further comprising:
a horizontal signal line which is connected to a first capacitor element and a second capacitor element,
wherein a capacitor selector is operable to perform selecting so that amplified signals in said first capacitor element and said second capacitor element are separately read out to said horizontal signal line.

7. The solid-state image pickup device according to claim 4, further comprising:
a first horizontal signal line and a second horizontal signal line which are connected to a first capacitor element and a second capacitor element, respectively.

8. The solid-state image pickup device according to claim 1,
wherein a shorter one of the first period and the second period is shorter than one horizontal scanning period.

9. The solid-state image pickup device according to claim 8, further comprising:
a horizontal signal line which is connected to said first capacitor element and said second capacitor element,
wherein said capacitor selector is operable to perform the selecting so that the amplified signals in the first capacitor element and the second capacitor element are read out to said horizontal signal line at a same time.

10. The solid-state image pickup device according to claim 1,
wherein the first period and second period are shorter than one vertical scanning period.

11. An amplification-type solid-state image pickup device, comprising:
a plurality of unit cells including (i) a photoelectric converter operable to convert light into signal charges and to accumulate the signal charges, and (ii) a reader operable to read the signal charges from said photoelectric converter, said unit cells being arranged by rows and columns, each of said unit cells being operable to output amplified signals corresponding to the signal charges; and
a read controller operable to control said reader to read the signal charges accumulated during a first period and during a second period, the first period and the second period being accumulation time periods different from each other,
wherein said read controller is operable to control said reader to read the signal charges accumulated during the first and second periods which are different from each other when the amplified signals of said unit cells in a plurality of the rows are not added together, and control said reader to add together signal charges accumulated during a third accumulation time period in different rows and to read the added signal charges when the amplified signals of said unit cells in the plurality of the rows are added together.

12. The solid-state image pickup device according to claim 11, further comprising:
a row selector operable to select a row;
a first capacitor element and a second capacitor element which are connected to each of the columns of said unit cells; and
a capacitor selector operable to select an arbitrary capacitor element out of said first capacitor element and said second capacitor element,
wherein said capacitor selector is operable to perform the selecting so that the amplified signals corresponding to the signal charges accumulated during the first period and the second period are accumulated into said first capacitor element and the second capacitor element, respectively, when the amplified signals of said unit cells in the plurality of the rows are not added together, and perform the selecting so that the amplified signals corresponding to the signal charges accumulated during the third accumulation time period in said different unit cells in the plurality of the rows are accumulated into one of said first capacitor element and said second capacitor element, when the amplified signals of said unit cells in the plurality of the rows are added together.

* * * * *